(12) United States Patent
Cho

(10) Patent No.: US 7,387,920 B2
(45) Date of Patent: Jun. 17, 2008

(54) METHOD OF MANUFACTURING THIN FILM TRANSISTOR ARRAY PANEL

(75) Inventor: Sung-Hwan Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 456 days.

(21) Appl. No.: 11/119,689

(22) Filed: May 2, 2005

(65) Prior Publication Data

US 2005/0272189 A1 Dec. 8, 2005

(30) Foreign Application Priority Data

Apr. 30, 2004 (KR) .................... 10-2004-0030425

(51) Int. Cl.
*H01L 21/84* (2006.01)

(52) U.S. Cl. .................... 438/163; 438/155; 257/350; 257/72; 257/E21.411; 349/43; 349/46

(58) Field of Classification Search ............... 438/155, 438/163; 257/350, 72, E21.411; 349/43, 349/46
See application file for complete search history.

(56) References Cited

U.S. PATENT DOCUMENTS

| | | | |
|---|---|---|---|
| 6,423,586 B1 | 7/2002 | Yamazaki et al. | |
| 6,617,644 B1 | 9/2003 | Yamazaki et al. | |
| 2001/0049197 A1* | 12/2001 | Yamazaki et al. | 438/689 |
| 2002/0158995 A1* | 10/2002 | Hwang et al. | 349/43 |
| 2003/0030080 A1* | 2/2003 | Dai et al. | 257/288 |
| 2003/0100151 A1* | 5/2003 | Okamoto | 438/163 |
| 2004/0126914 A1* | 7/2004 | Chang et al. | 438/30 |

FOREIGN PATENT DOCUMENTS

| | | |
|---|---|---|
| JP | 2001250955 | 9/2001 |
| JP | 2001345453 | 12/2001 |
| JP | 2003045889 | 2/2003 |
| KR | 1998042511 | 8/1998 |
| KR | 1019990086657 | 12/1999 |
| KR | 1020000032041 | 6/2000 |
| KR | 1020000039312 | 7/2000 |
| KR | 1020000039960 | 7/2000 |
| KR | 100271491 | 8/2000 |
| KR | 100275716 | 9/2000 |

(Continued)

*Primary Examiner*—B. William Baumeister
*Assistant Examiner*—Steven J. Fulk
(74) *Attorney, Agent, or Firm*—Cantor Colburn LLP

(57) ABSTRACT

A method of manufacturing a thin film transistor array panel is provided, which includes forming a semiconductor layer of poly silicon, forming a gate insulating layer on the semiconductor layer, forming a conductive layer including a first metal layer and a second metal layer formed on the first metal layer, depositing and forming a photoresist pattern on the first and the second metal layer, forming a gate electrode by etching the conductive layer, wherein the gate electrode includes a double layered structure including the first metal layers having a narrower width than a width of the second metal layer, forming a source region and a drain region in the semiconductor layer by doping conductive impurities, ashing the photoresist pattern to expose a portion of the second metal, etching the exposed portion of the second metal layer, removing the photoresist pattern, and forming lightly doped drain regions having a lower concentration compared to the source region and the drain region by using the gate electrode as a doping mask.

20 Claims, 23 Drawing Sheets

FOREIGN PATENT DOCUMENTS

| | | |
|---|---|---|
| KR | 100292044 | 3/2001 |
| KR | 1020010090590 | 10/2001 |
| KR | 1020010091799 | 10/2001 |
| KR | 100315648 | 11/2001 |
| KR | 1020020091898 | 12/2002 |
| KR | 100370111 | 1/2003 |
| KR | 1020030041694 | 5/2003 |
| KR | 1020030078208 | 10/2003 |
| KR | 1020040004176 | 1/2004 |

* cited by examiner

METHOD OF MANUFACTURING THIN FILM TRANSISTOR ARRAY PANEL

This application claims priority to Korean Patent Application No. 10-2004-0030425, filed on Apr. 30, 2004, the contents of which in its entirety are herein incorporated by reference.

BACKGROUND OF THE INVENTION

1. Field of the Invention

The present invention relates to a method of manufacturing a thin film transistor array panel.

2. Description of Related Art

A flat panel display such as a liquid crystal display (LCD) and an organic light emitting display (OLED) includes a thin film transistor array panel including a plurality of pixel electrodes, a plurality of thin film transistors (TFTs) connected thereto, a plurality of signal lines connected to the TFTs, a plurality of drivers for driving the display panel, and a controller for controlling the drivers.

The signal lines include gate lines for transmitting gate signals from the drivers to the TFTs and data lines for transmitting data signals from the drivers to the TFTs.

A TFT includes a semiconductor layer of amorphous silicon or polysilicon, a gate electrode connected to the gate line, a source electrode connected to the data line, and a drain electrode connected to the pixel electrode.

A polysilicon TFT, using a polysilicon such as a semiconductor layer, has the relatively high electron mobility by amorphous silicon TFT, and the polysilicon TFT enables the implementation of a chip in glass technique that a display panel embeds its driving circuits.

A TFT including a polysilicon layer usually places the gate electrode on the polysilicon layer and the polysilicon layer includes lightly doped drain (LDD) regions disposed between a channel region and source and drain regions for reducing punch through, etc.

A gate overlapped lightly doped drain (GOLDD) TFT, which has lightly doped drain regions overlapping the gate electrode, is widely used in metal oxide semiconductor ("MOS") TFT technique, because the GOLDD TFT has a high reliability in comparison with a general LDD TFT, and reduces off current without the drop of on current. Particularly, a TFT having a short channel adopts the GOLDD type rather than the general LDD type on account of the reliability of the TFT due to hat carriers.

However, it is difficult to control a doping concentration with N type impurity in a manufacturing method of the conventional GOLDD structure and to apply an excimer laser annealing process having high activation ratio to such a manufacturing method.

SUMMARY OF THE INVENTION

The present invention provides a manufacturing method of a thin film transistor array panel that is enhancing the reliability of characteristics of thin film transistors by forming the stable LDD regions with excimer laser annealing activation at a time.

A method of manufacturing a thin film transistor array panel is provided, the method including: forming a semiconductor layer of polysilicon; forming a gate insulating layer on the semiconductor layer; forming a conductive layer including a first metal layer and a second metal layer formed on the first metal layer; depositing and forming a photoresist pattern on the first and the second metal layer; forming a gate electrode by etching the conductive layer, wherein the gate electrode includes a double layered structure including the first metal layer having a narrower width than a width of the second metal layer; forming a source region and a drain region in the semiconductor layer by doping conductive impurities; ashing the photoresist pattern to expose a portion of the second metal layer; etching the exposed portion of the second metal layer; removing the photoresist pattern; and forming lightly doped drain regions having a lower concentration compared to the source region and the drain region by using the gate electrode as a doping mask.

The second metal layer may be used as a doping mask when the source and the drain regions are formed, and the second metal layer may have substantially the same width as the first metal layer after etching the exposed portion of the second metal layer.

The method may further include activating conductive impurities of the semiconductor layer by using laser annealing. The method may further include forming a conductor pattern covering the gate electrode and the portion of the semiconductor layer exposed from the gate electrode.

The first metal layer may be over-etched by using spray wet-etch method when the gate electrode is formed. The spray wet-etch method may have etch selectivity for the first and second metal layers. The double layered structure of the first and second layers may include one selected from Al/Mo, Mo/Al, Al—Nd alloy/Mo—W alloy, Mo—W alloy/Al—Nd alloy, and Mo/ITO.

The thicknesses of the first and second metal layers may be in the range of about 1,000-2,500 Å.

The formation of the gate electrode comprises: etching the first and the second metal layer together; and forming the first metal layer having under-cut structure by using electro chemical reaction between the first and second metal layers. The first and the second metal layers comprise materials having substantially the same etch ratio for aluminum etchant. The first and the second metal layers may be etched by using spray wet-etch method when the gate electrode is formed.

In another embodiment, a method of manufacturing a thin film transistor includes forming a semiconductor layer on a substrate, forming a gate insulating layer on the semiconductor layer, forming a gate line on the gate insulating layer, forming a plurality of data metal pieces on the gate insulating layer, wherein the data metal pieces extend perpendicularly to the gate line, and wherein the data metal pieces do not connect with the gate line, forming an interlayer insulating layer on the gate insulating layer, the gate line, and the data metal pieces, forming a data connection part on the interlayer insulating layer, wherein the data connection part passes perpendicularly over the gate line, and connecting the data connection part to a first data metal piece at a first contact hole and connecting the data connection part to a second data metal piece at a second contact hole.

In another embodiment, a method of manufacturing a driver of a thin film transistor includes forming first and second semiconductor layers of polysilicon; forming a conductive layer including a first metal layer and a second metal layer formed on the first metal layer over the first and second semiconductor layers, forming first and second gate electrodes from the conductive layer, forming first and second photoresist patterns on the first and second gate electrodes, respectively, wherein the first photoresist pattern has a width equivalent to a width of a second metal layer for the first gate electrode, and wherein a second photoresist pattern covers all accessible surfaces of the second gate electrode, wherein, for the first semiconductor layer and the first gate electrode, the method further comprises etching the first metal layer for providing the first metal layer with a narrow width than a second metal layer and the first photoresist pattern, using the second metal layer and the first photoresist pattern as a doping mask to form a source region and a drain region in the first semiconductor layer, exposing the second metal layer and processing the second metal layer to have a width substantially the same as a width of the first metal layer thereof, forming lightly doped drain regions having a lower concentration compared to the source and the drain regions by using the first gate electrode as a doping mask.

BRIEF DESCRIPTION OF THE DRAWINGS

The present invention will become more apparent by describing embodiments thereof in detail with reference to the accompanying drawings in which.

DETAILED DESCRIPTION OF THE INVENTION

Figure 1:
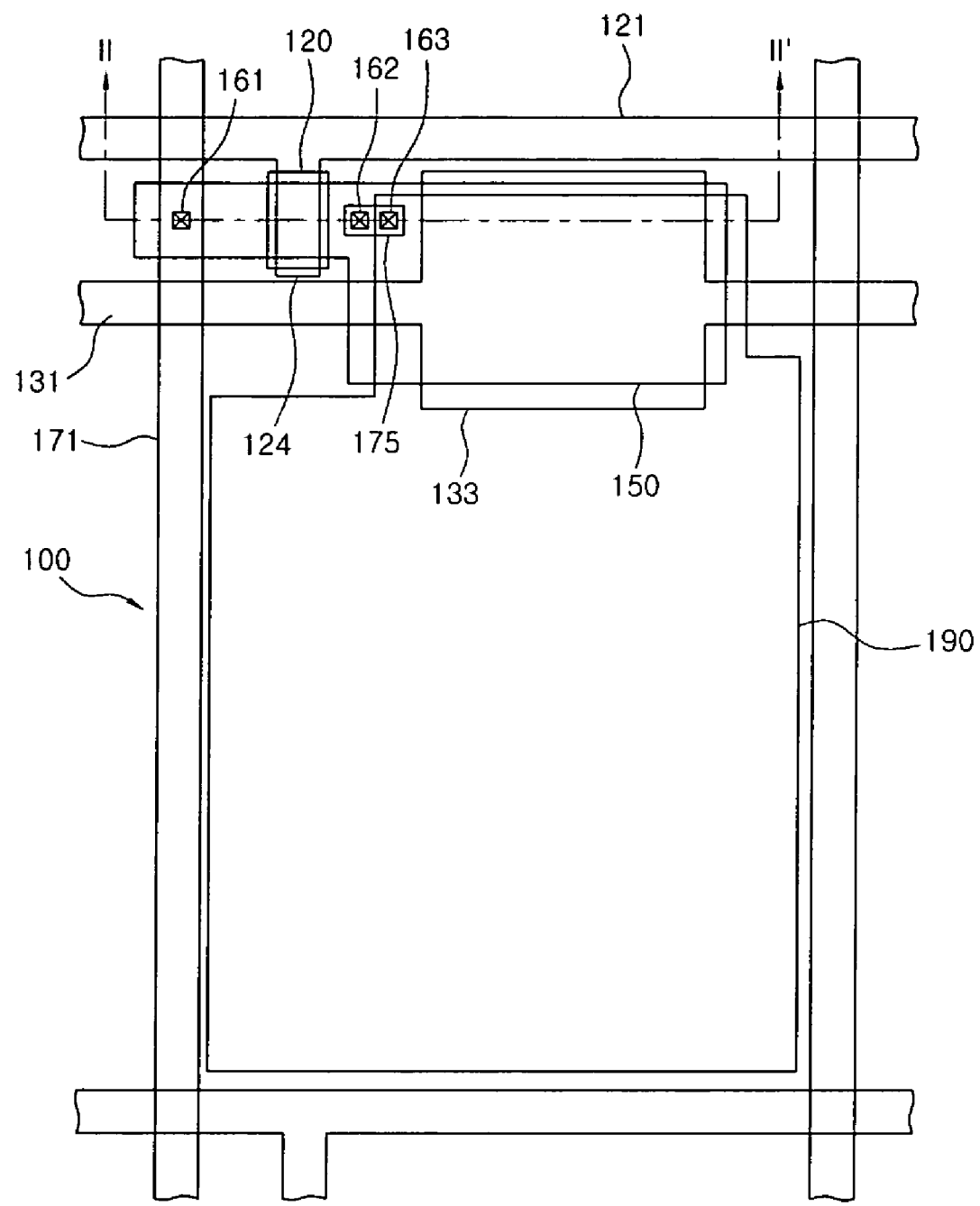
FIG. 1 is a layout view of the TFT array panel according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, manufacturing method for thin film transistor array panel according to embodiments of the present invention will be described with reference to the accompanying drawings. A method where an excimer laser annealing process is executed is provided as will be further described below.

Figure 2:
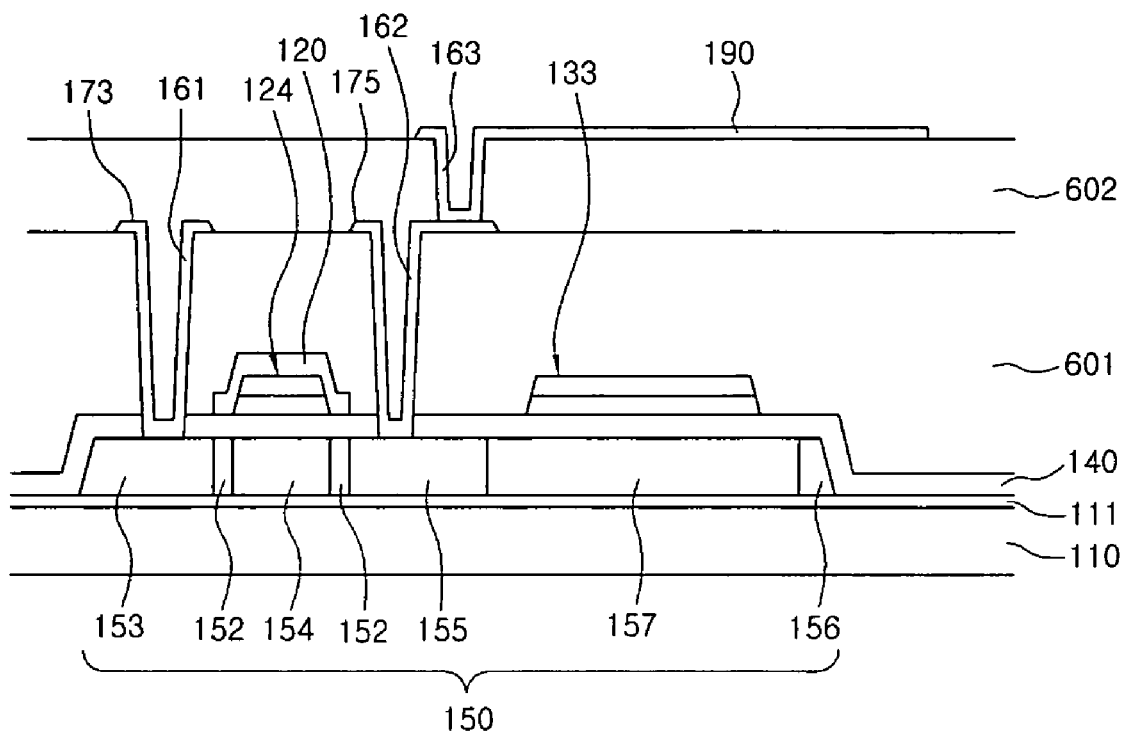
FIG. 2 is a sectional view of the display area shown in FIG. 1 taken along line II-II'.

FIG. 1 is a layout view of the TFT array panel 100 shown in FIGS. 1 and 2 according to an embodiment of the present invention, and FIG. 2 is a sectional view of the display area shown in FIG. 1 taken along line II-II'.

A blocking film 111 exemplararily made of silicon oxide ($SiO_2$) or silicon nitride (SiNx) is formed on an insulating substrate 110 such as transparent glass, quartz or sapphire. The blocking film 111 may have a dual-layered structure.

A plurality of semiconductor layers 150 preferably made of polysilicon are formed on the blocking film or layer 111. The semiconductor layers 150 form "islands" on the blocking film 111, and therefore may also be termed semiconductor islands. While only one semiconductor layer 150 is shown in FIGS. 1 and 2, it should be understood that a plurality of such semiconductor layers 150 are similarly formed on the blocking film or layer 111. The semiconductor layers 150 include a plurality of extrinsic regions containing N type or P type conductive impurity and at least one intrinsic region hardly containing conductive impurity. It should be understood that an impurity is a substance that is incorporated into a semiconductor material and provides free electrons (N-type impurity) or holes (P-type impurity).

Concerning the semiconductor layers 150, the intrinsic regions include a channel region 154, and the extrinsic regions are doped with N type impurity such as phosphorous (P) and arsenic (As) and include a plurality of heavily doped regions such as source and drain regions 153 and 155 separated from each other with respect to the channel region 154, and the lightly doped drain (LDD) regions 152 respectively disposed between the source region 153 and the channel region 154, and the drain region 155 and the channel region 154.

The LDD regions 152 prevent leakage current and a "punch through" phenomenon, where a punch-through voltage may represent junction breakdown. The source region 153 and the drain region 155 are doped with conductive impurities of high concentration, whereas the LDD regions 152 are doped with conductive impurities of low concentration. A plurality of offset regions without conductive impurities substitutes the LDD regions 152.

The conductive impurities are either P-type or N-type. Boron (B) or gallium (Ga) may be used as the P-type and phosphorus (P) or arsenic (As) can be used as the N-type.

A gate insulating layer 140 made of silicon nitride (SiNx) or silicon oxide ($SiO_2$) is formed on the semiconductor layers 150.

A plurality of gate lines 121 and a storage electrode line 131 are formed on the gate insulating layer 140, respectively. The gate lines 121 for transmitting gate signals extend substantially in a transverse direction and include a plurality of gate electrodes 124 protruding downward to overlap the channel regions 154 of the semiconductor layers 150. The gate lines 121 are made of double layered structure including a first layer and a second layer, where the first layer may be formed of a metallic material. The LDD regions 152 can be overlapped with the gate line 121. The Each gate line 121 may include an expanded end portion having a large area for contact with another layer or an external driving circuit. The gate lines 121 may be directly connected to a gate driving circuit for generating the gate signals, which may be integrated on the insulating substrate 110.

The storage electrode line 131 is supplied with a predetermined voltage such as a common voltage to form a storage capacitance of a pixel and includes a storage electrode 133 protruding from the gate insulating layer 140 and overlapping the storage regions 157 of the semiconductor layer 150. As shown in FIG. 1, the storage electrode 133 may extend beyond the semiconductor layer 150 towards the gate lines 121. That is, the storage electrode 133 may have a width that is smaller than a width of one semiconductor layer 150, but a length that is slightly longer than one semiconductor layer 150 as shown in FIG. 1, although alternate configurations are within the scope of this embodiment. Each semiconductor layer 150 further includes a heavily doped region 156, which is located beside the storage region 157.

A plurality of conductor patterns 120 having a wider width than the gate electrodes 124 are formed on the gate electrodes 124. The LDD regions 152 overlap the conductor pattern 120, thereby GOLDD type is achieved. That is, as shown in FIG. 2, the conductor pattern 120 is positioned over the LDD regions 152, and therefore a gate overlapped lightly doped drain, GOLDD, is formed.

A first interlayer insulating layer 601 is formed on the gate insulating layer 140, the gate lines 121, the storage electrode lines 131, and the conductor patterns 120. The first interlayer insulating layer 601 along with the gate insulating layer 140 includes a first contact hole 161 and a second contact hole 162 through which the source region 153 and the drain region 155 are exposed, respectively.

A plurality of data lines 171 and a plurality of drain electrodes 175 are formed on the first interlayer insulating layer 601. When an adjacent parallel pair of the data lines 171 and an adjacent parallel pair of the gate lines 121 are intersected, a pixel region is defined therein, within the rectangular area formed therebetween. A portion of the data line 171 is connected with the source region 153 through the first contact hole 161 to form a source electrode 173 of TFT. An end of the data line 171 may be formed wider than the rest of the data line 171 to connect with exterior circuitry.

A drain electrode 175 is formed on the same layer as the data line 171, having a predetermined distance from the source electrode 173. The drain electrode 175 is connected with the drain region 155 through the second contact hole 162.

A second interlayer insulating layer 602 is formed on the first interlayer insulating layer 601, the drain electrode 175, and the data line 171. The second interlayer insulating layer 602 includes a third contact hole 163 through which the drain electrode 175 is exposed.

A pixel electrode 190 is formed on the second interlayer insulating layer 602 and is connected with the drain electrode 175 through the third contact hole 163.

Hereinafter, a method of manufacturing the above-mentioned TFT array panel 100 will be described with reference to FIGS. 3A through 9B, along with the above-referenced FIG. 1 and FIG. 2.

FIGS. 3A, 4A, 5, 6A, 6B, 7A, 8A, and 9A are plan views showing intermediate steps to manufacture a TFT array panel shown in FIGS. 1 and 2 according to an embodiment of the present invention. FIG. 3B is a cross-sectional view of the TFT array panel 100 shown in FIG. 3A taken along line IIIB-IIIB', and FIGS. 4B and 4C are cross-sectional views of the TFT array panel 100 shown in FIG. 4A taken along line IVB-IVB'. FIG. 7B is a cross-sectional view of the TFT array panel 100 shown in FIG. 7A taken along line VIIB-VIIB', FIG. 8B is a cross-sectional view of the TFT array panel 100 shown in FIG. 8A taken along line VIIIB-VIIIB', and FIG. 9B is a cross-sectional view of the TFT array panel 100 shown in FIG. 9A taken along line IXB-IXB'.

Figure 3A:
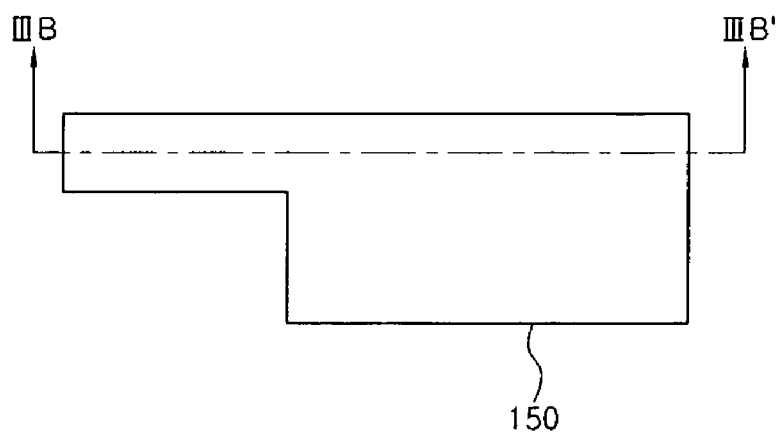
FIGS. 3A, 4A, 5, 6A, 6B, 7A, 8A, and 9A are plan views showing stages of manufacturing a TFT array panel shown in FIGS. 1 and 2 according to an embodiment of the present invention.
Figure 3B:
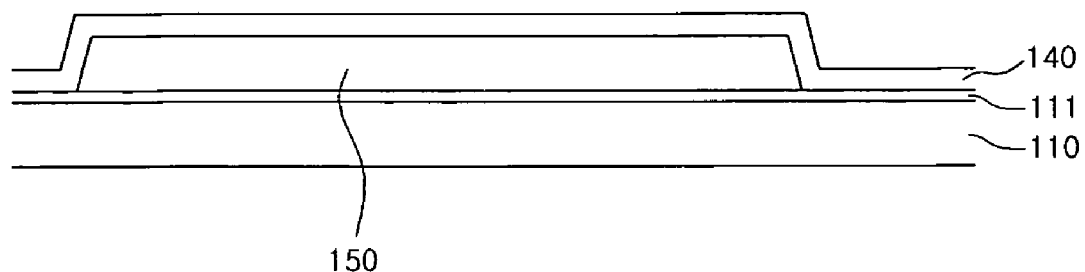
FIG. 3B is a cross-sectional view of the TFT array panel shown in FIG. 3A taken along line IIIB-IIIB'.

As shown in FIGS. 3A and 3B, a blocking layer 111 is formed on a transparent insulating substrate 110. The transparent insulating substrate 110 can be made of glass, quartz, sapphire, etc. The blocking layer 111 is formed by depositing silicon oxide ($SiO_2$) or silicon nitride (SiNx) onto the insulating substrate 110 with a thickness of about 1000 Å. Then, the surface is cleaned to remove impurities such as a natural oxide layer from the blocking layer 111.

An intrinsic amorphous silicon layer is formed within the range of 500 Å to 1500 Å thick by chemical vapor deposition (CVD), etc. With CVD, a substrate is exposed to one or more vaporized compounds, one or more of which contain desirable constituents. A chemical reaction is initiated, at or near the substrate surface, to produce the desired material that will condense on the substrate.

Next, the amorphous silicon layer is crystallized by a sequential lateral solidification (SLS) process, an excimer laser anneal process, or a chamber anneal process to form a poly crystalline silicon layer. The SLS process is a materials process creating high quality crystalline silicon films on glass or plastic substrates. The excimer laser anneal process allows the excimer laser light to be absorbed in the amorphous silicon layer without heating the underlying layer. Within the laser pulse duration, the amorphous silicon layer is rapidly heated and melted. As it cools down, the re-crystallization into poly-silicon occurs. The chamber anneal process heats the amorphous silicon layer in a chamber before allowing it to cool down and crystallize. The resultant poly crystalline silicon layer is patterned by photolithography using an optic mask to form the semiconductor layer 150. Photolithography is a process used to transfer a pattern from the optic mask to the layer of resist deposited on the surface. The optic mask blocks resist exposure to UV radiation in selected areas and includes chrome opaque areas supported by a plate transparent to UV radiation.

Next, insulating material such as SiNx, $SiO_2$, etc. is deposited on the semiconductor layer 150 by CVD process to form a gate insulating layer 140.

Figure 4A:
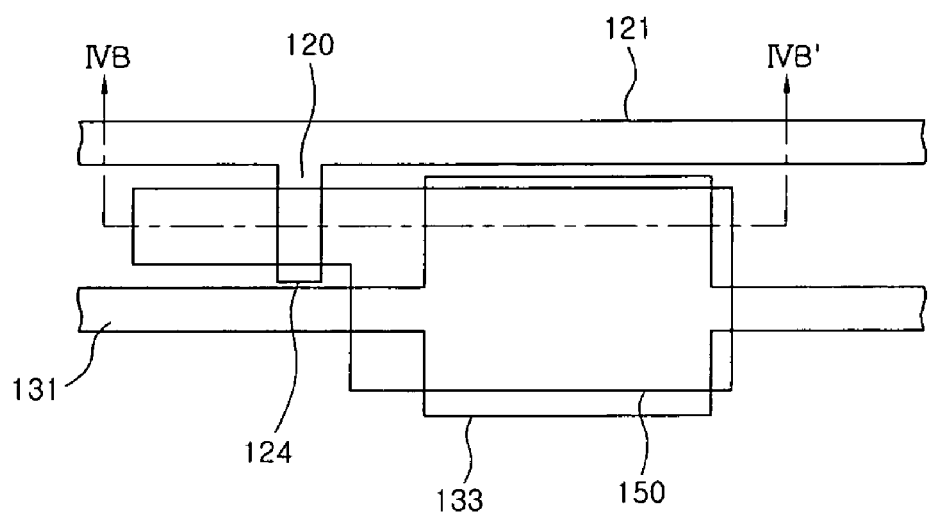
Figure 4B:
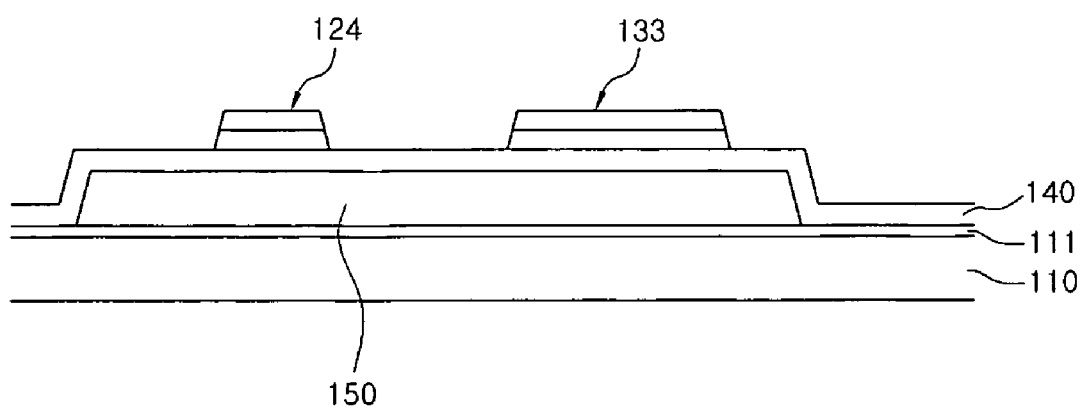
FIGS. 4B and 4C are cross-sectional views of the TFT array panel shown in FIG. 4A taken along line IVB-IVB'.
Figure 4C:
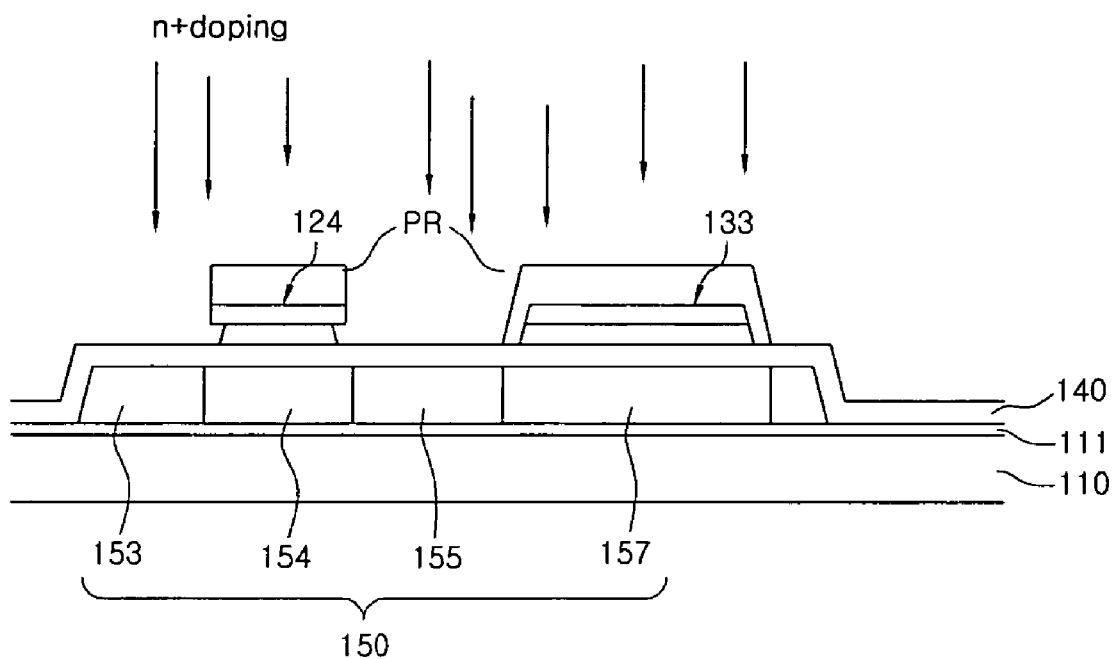

As shown in FIGS. 4A and 4B, a conductive layer of a double layered structure including a first metal layer and a second metal layer is deposited on the gate insulating layer 140. The first metal layer is deposited directly on the gate insulating layer 140, and the second metal layer is deposited on the first metal layer such that the first metal layer is between the second metal layer and the gate insulating layer 140. The first and the second metal layers are made of at least one of silver (Ag), copper (Cu), titanium (Ti), aluminum (Al), tungsten (W), molybdenum (Mo), neodymium (Nd) and alloy thereof.

After forming the conductive layer, a photoresist layer is formed on the conductive layer, and the conductive layer is etched by using the photoresist layer as a photo mask to form a plurality of gate lines 121 and a storage electrode line 131. The photoresist layer is a photo-sensitive material that is exposed to a pattern using a lithography process. During developing, exposed portions of resist are removed leaving a positive image of the mask pattern on the surface. The double layered structure of the first and the second layers may include one selected from Al/Mo, Mo/Al, Al—Nd alloy/Mo—W alloy, Mo—W alloy/Al—Nd alloy, and Mo/ITO, and the thicknesses of the first and the second metal layers respectively are in the range of about 1,000-2,500 Å.

As shown in FIG. 4c, a photoresist layer is deposited on the gate insulating layer 140, and developed to form a photoresist pattern PR. At this time, the first metal layer of the gate electrode 124 is over-etched by using a spray wet-etch method having etch selectivity for the first and the second metal layers in order that the first metal layer of the gate electrode 124 has narrower widths than that of the photoresist pattern PR and the second metal layer of the gate electrode 124. Wet-etch method is a process that uses a chemical (such as by spraying a chemical or bathing a surface in a chemical) to remove unwanted substances from a surface.

The first and the second metal layers may be etched together, and then electro chemical reaction between the first and the second metal layers may be used to form the first metal layer having an under-cut structure.

In the formation of the gate electrode 124, the etchant may be aluminum etchant for Al metal, and it is preferable that the first and the second metal layers comprise materials having substantially the same etch ratio for aluminum etchant.

The gate line 121 and the storage electrode 131 can advantageously have tapered lateral sides, so that the gate line 121 and the storage line 131 can be adhered more tightly with the overlying layer. In addition, it is possible to omit the storage electrode 131 if storage capacitance is sufficient without the storage electrode 131.

Then, the semiconductor layer 150 is heavily doped with conductive impurities using the second metal layer of the gate electrode 124 and the storage electrode 133, or the photoresist pattern PR as a doping mask to form a source region 153 and a drain region 155, and to define a channel region 154 and a storage region 157. It should be understood that doping is the introduction of dopant into a semiconductor for the purpose of altering its electrical properties, where the dopant is an element introduced into the semiconductor to establish either p-type (acceptors) or n-type (donors) conductivity.

Figure 5:
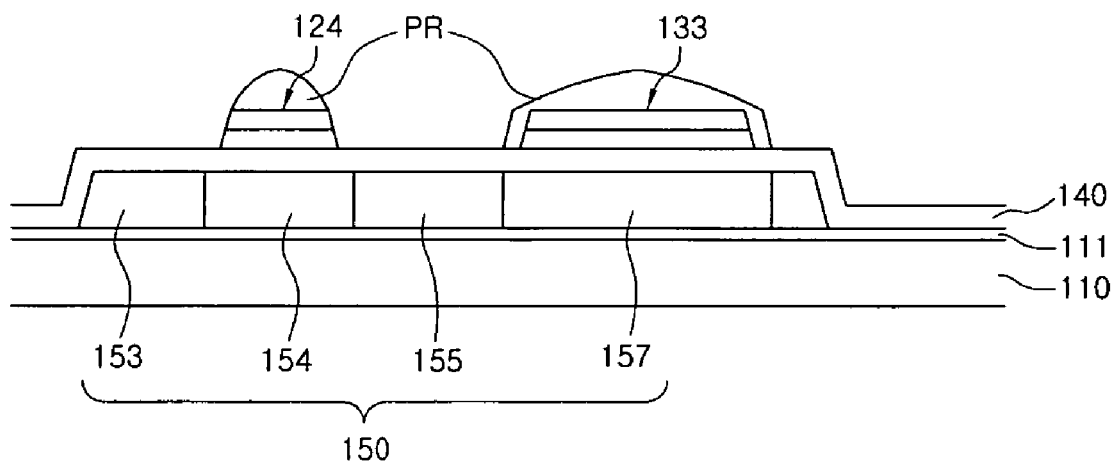

Next, as shown in FIG. 5, the photoresist pattern PR is ashed to expose the portion of the second metal of the gate electrode 124, and the exposed portion of the second metal of the gate electrode 124 are etched by dry etching until the width of the second metal layer of the gate electrode 124 is substantially equal to the width of the first metal layer of the gate electrode 124. Ashing is the removal, by volatilization, of organic materials, e.g. photoresist, from a surface using strongly oxidizing ambient, and dry etching is an etching process carried out in the gas phase which can be either purely chemical (e.g. plasma etching), purely physical (e.g. ion milling), or a combination of both (e.g. reactive ion etching).

Figure 6A:
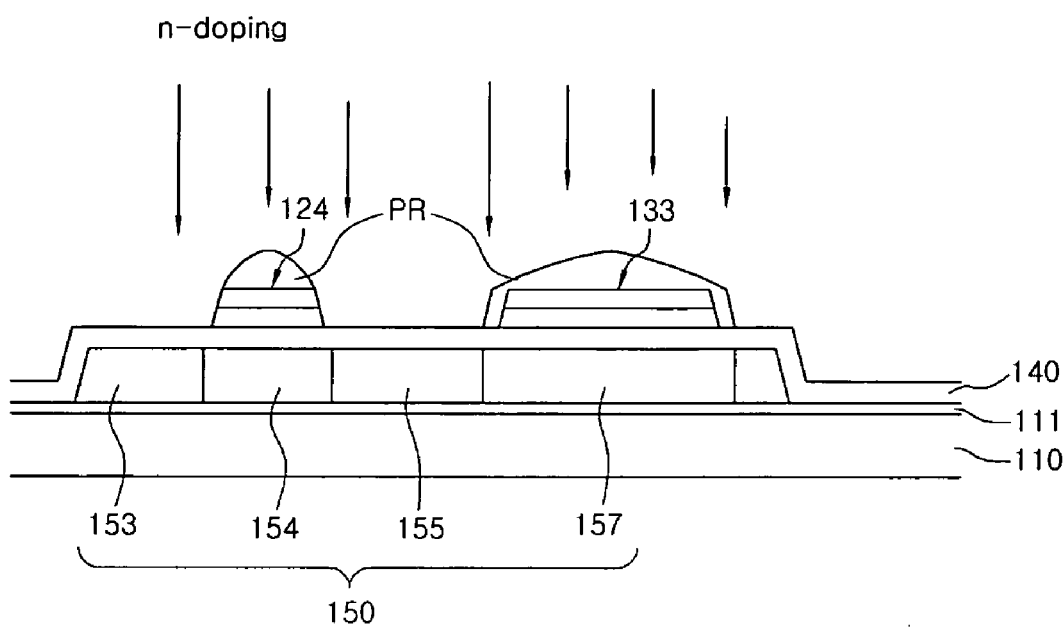
Figure 6B:
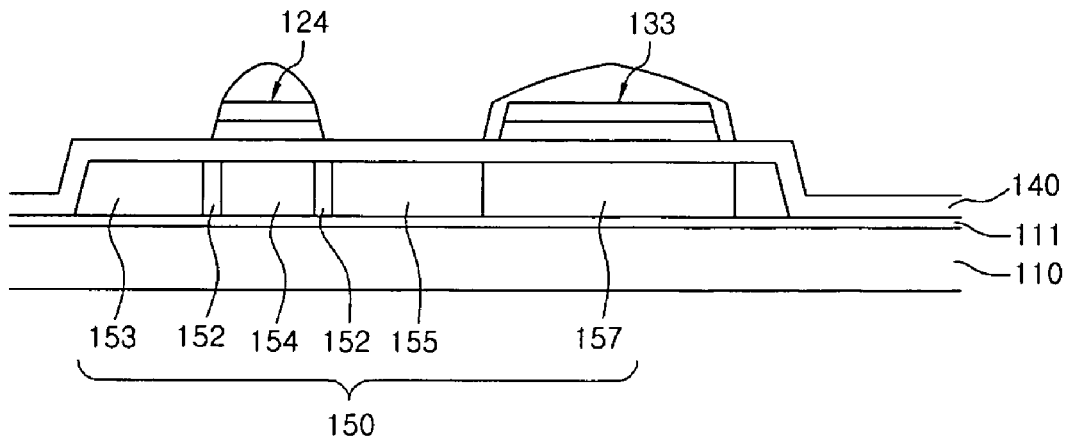

Subsequently, as shown in FIGS. 6A and 6B, the semiconductor layer 150 is lightly doped with conductive impurities using a doping mask of the photoresist pattern PR, or the gate electrode 124, thereby the semiconductor layer 150 having lightly doped drain (LDD) regions 152 is completed. Then, the photoresist pattern PR is removed.

The semiconductor layer 150 may further include some doped regions (not shown) located at the circumference of the storage electrode 133 according to the shape of the photoresist pattern PR, and the boundary of the storage region 157 may be changed.

Figure 7A:
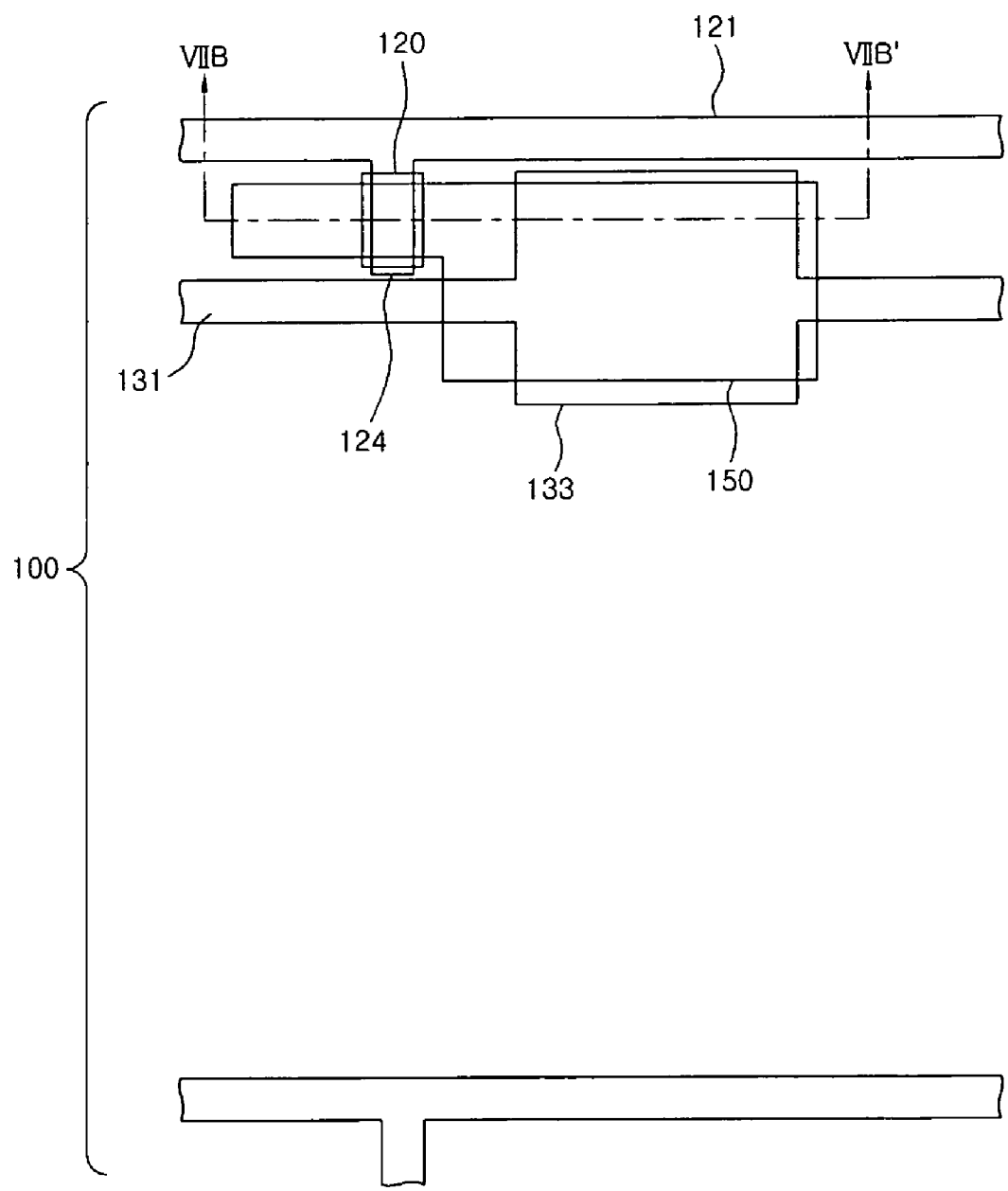
Figure 7B:
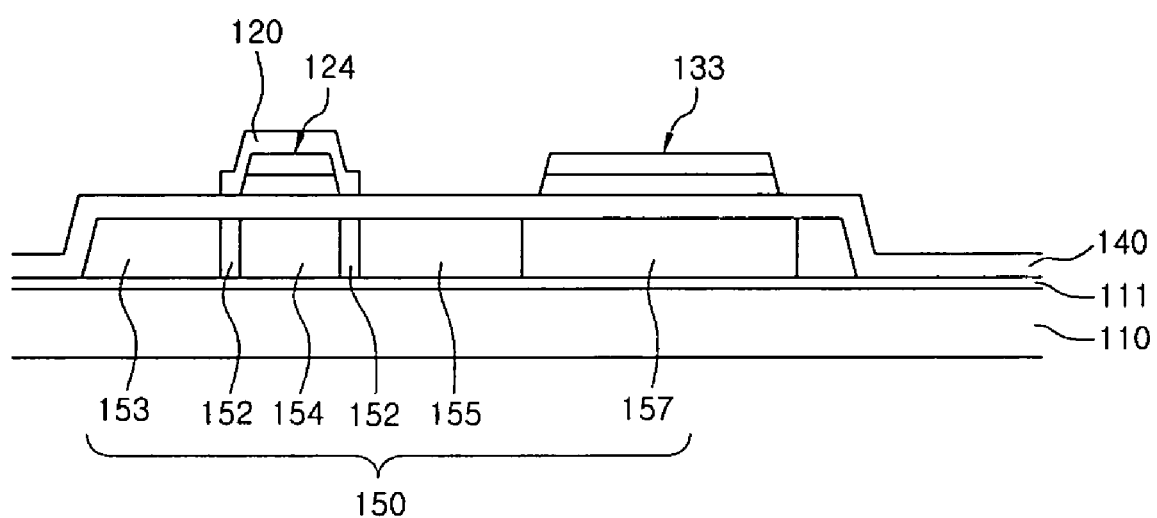
FIG. 7B is a cross-sectional view of the TFT array panel shown in FIG. 7A taken along line VIIB-VIIB'.

As shown in FIGS. 7A and 7B, a conductive layer is deposited on the gate line 121 and the storage electrode line 131, and etched through photolithography using a photo mask to form a plurality of conductor patterns 120.

At this time, the conductor patterns 120 completely cover the gate electrodes 124, and cover the portion of the semiconductor layer 150 on both sides of the gate electrodes 124.

The conductor patterns 120, as illustrated, have an island shape, but may be extended to have the same shape as that of the gate lines 121 and the storage line 131, and alternate various shapes would be within the scope of this TFT array panel.

Next, the semiconductor layers 150 are activated through thermal treatment such as, but not limited to, excimer laser annealing (ELA) etc. This thermal treatment may be executed after forming the lightly doped drain regions 152.

Figure 8A:
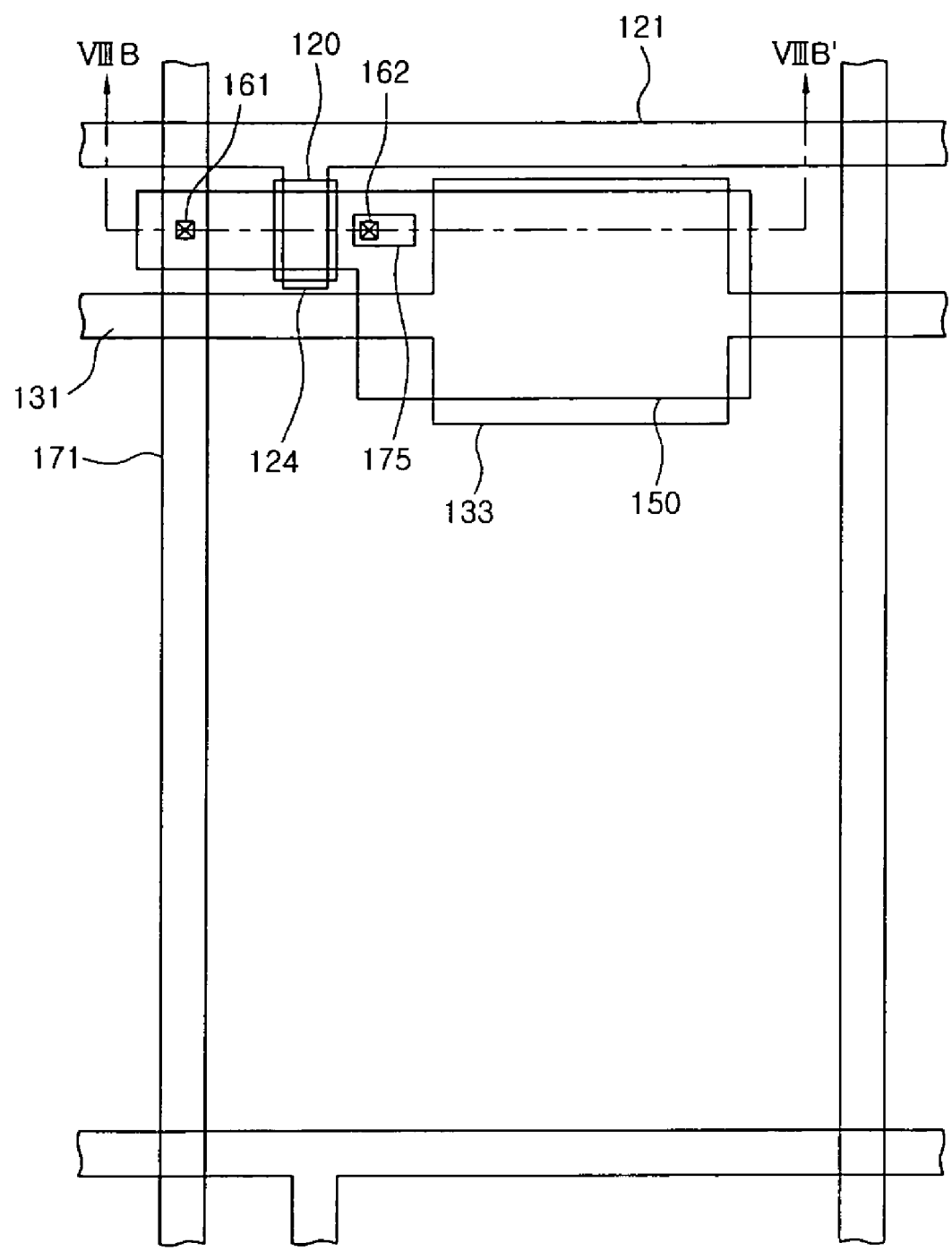
Figure 8B:
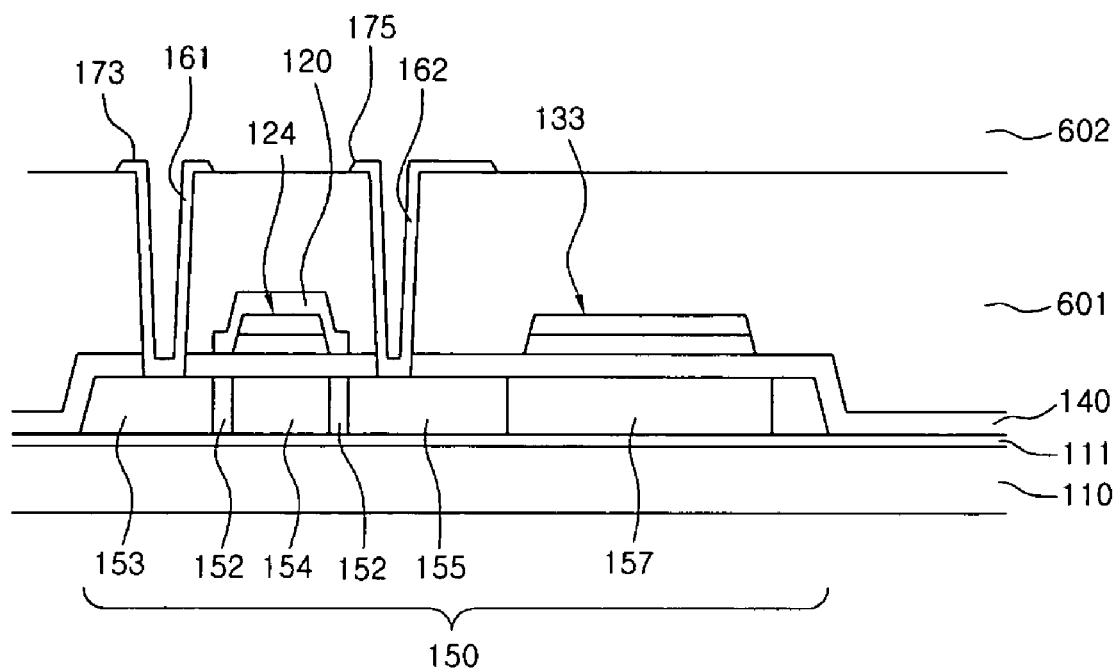
FIG. 8B is a cross-sectional view of the TFT array panel shown in FIG. 8A taken along line VIIIB-VIIIB'.

Next, as shown in FIG. 8A and FIG. 8B, a first interlayer insulating layer 601 is formed on the entire substrate 110, and then etched to form a first contact hole 161 and a second contact hole 162 where the source region 153 and the drain region 155 are respectively exposed.

The first interlayer insulating layer 601 can be made of an organic material having prominent planarization property and photosensitivity, an insulating material having low dielectric constant such as a-Si:C:O and a-Si:O:F, which are formed by plasma enhanced chemical vapor deposition (PECVD), or an inorganic material such as SiNx, etc.

Next, a metal layer made of tungsten (W), titanium (Ti), aluminum (Al), or alloy thereof is deposited on the first interlayer insulating layer 601 as a single layer or multi layers. The metal layer is then patterned by a photo etching process to form a data line 171 including a source electrode 173 that is connected with the source region 153 through the contact hole 161, and to form a drain electrode 175 which is connected with the drain region 155 through the contact hole 162.

The data line 171 and the drain electrode 175 in the illustrated embodiments have tapered lateral sides, so that the data line 171 and the drain electrode 175 can be adhered more tightly with the overlying layer.

Figure 9A:
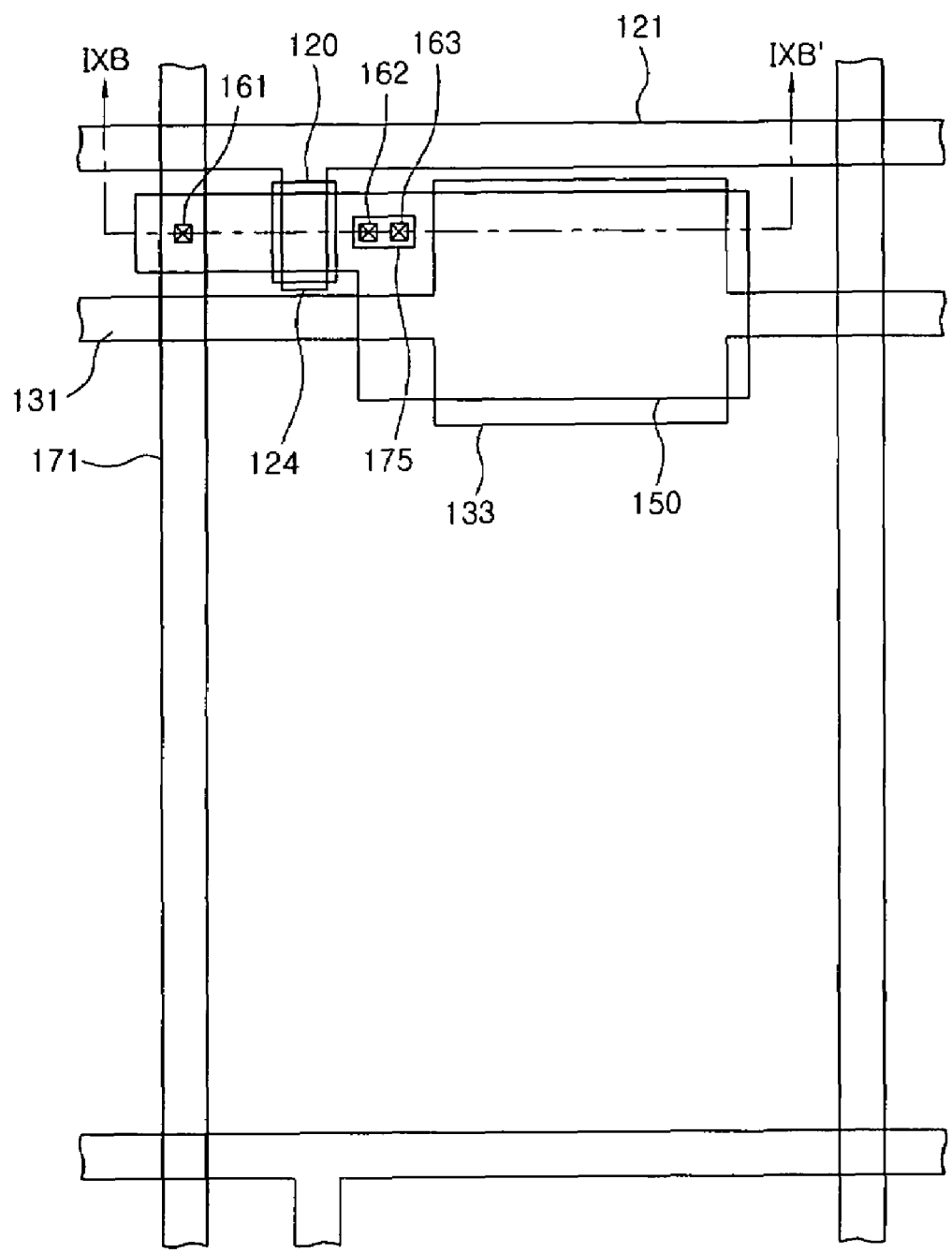
Figure 9B:
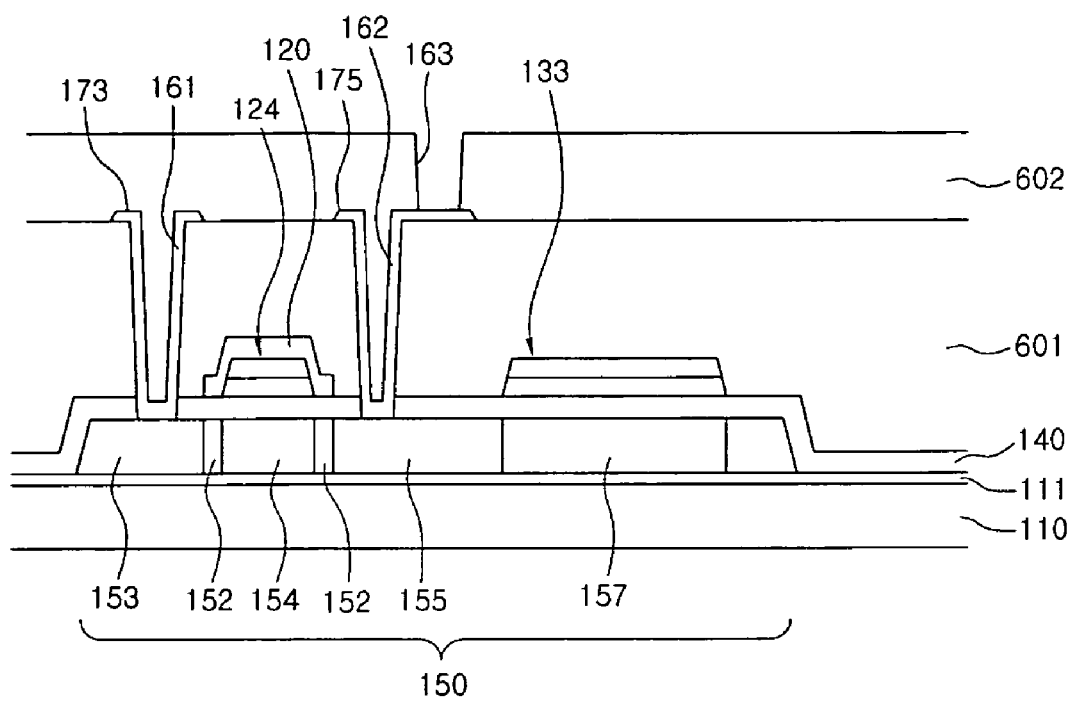
FIG. 9B is a cross-sectional view of the TFT array panel shown in FIG. 9A taken along line IXB-IXB'.

As shown in FIG. 9A and FIG. 9B, a second interlayer insulating layer 602 is formed to cover the data line 171 and the drain electrode 175. Then, the second interlayer insulating layer 602 is patterned by a photo etching process to form a third contact hole 163 through which the drain electrode 175 is exposed. The second interlayer insulating layer 602 can be made of the same material as the first interlayer insulating layer 601.

As shown in FIG. 1 and FIG. 2, a transparent conductive material such as indium zinc oxide (IZO), indium tin oxide (ITO), etc., is deposited on the second interlayer insulating layer 602. The transparent conductive layer is then patterned to form a pixel electrode 190 connected with the drain electrode 175 through the third contact hole 163.

In the case where the second interlayer insulating layer 602 is made of insulating materials of low dielectric constant, the pixel electrode 190 may overlap the data line 171 and the gate line 121, so that the aperture ratio of the pixel electrode 190 is enhanced. The aperture ratio is the ratio between the transmissive portion of the pixel and its surrounding electronics, where a higher aperture ratio indicates brighter luminance.

As described above, because the plurality of doped regions including heavily doped regions 153, 155 and 156 and the lightly doped regions 152 are formed by using the conductive layer including double layered structure, the doped regions may be activated by executing excimer laser annealing activation at a time, thereby simplifying the manufacturing method to reduce the manufacturing cost. The reliability and characteristics of thin film transistors may be enhanced by using the conductor pattern formed on the gate electrode 124 to form stable GOLDD.

Figure 10:
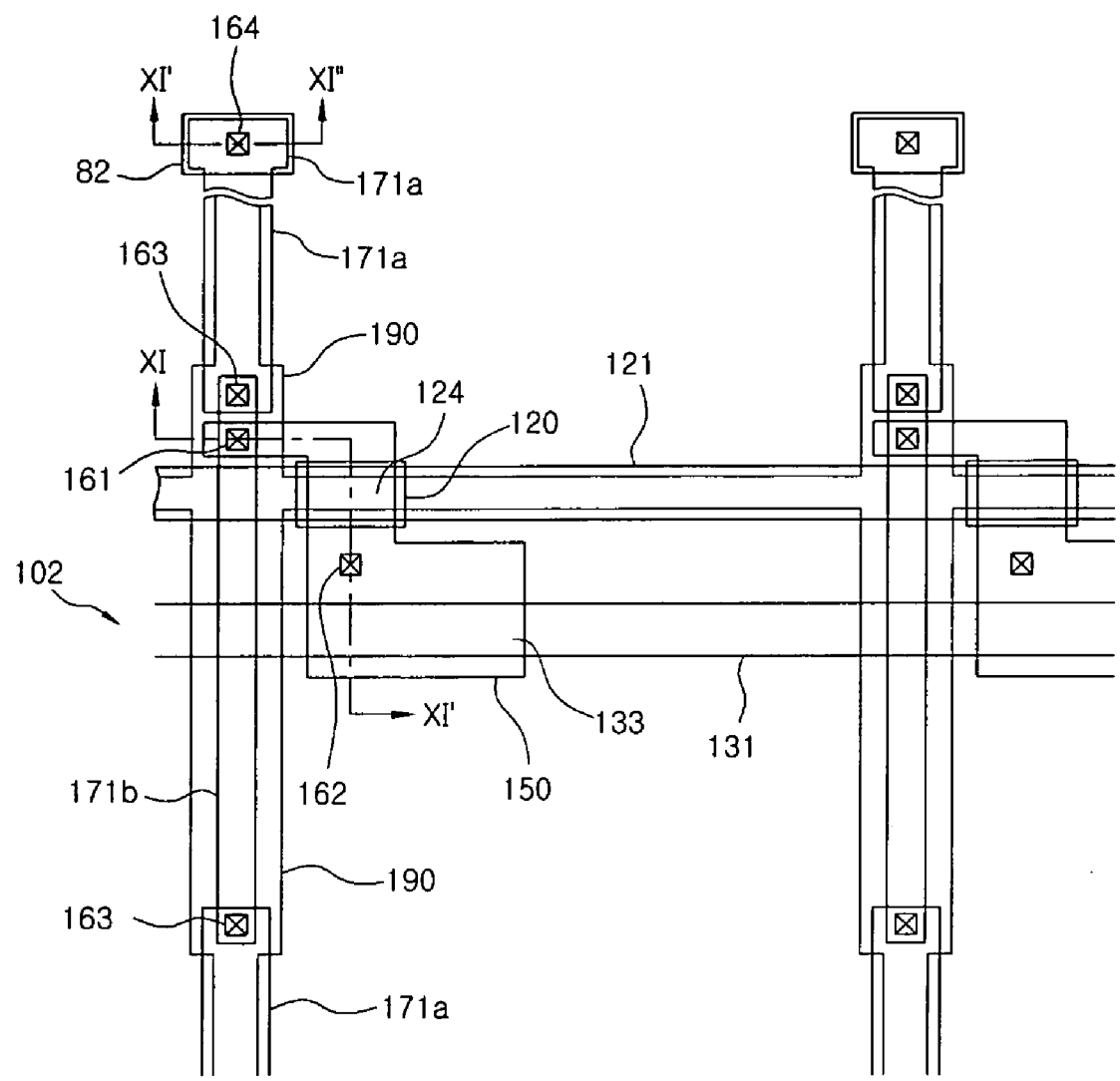
FIG. 10 is a layout view of the TFT array panel according to another embodiment of the present invention.
Figure 11:
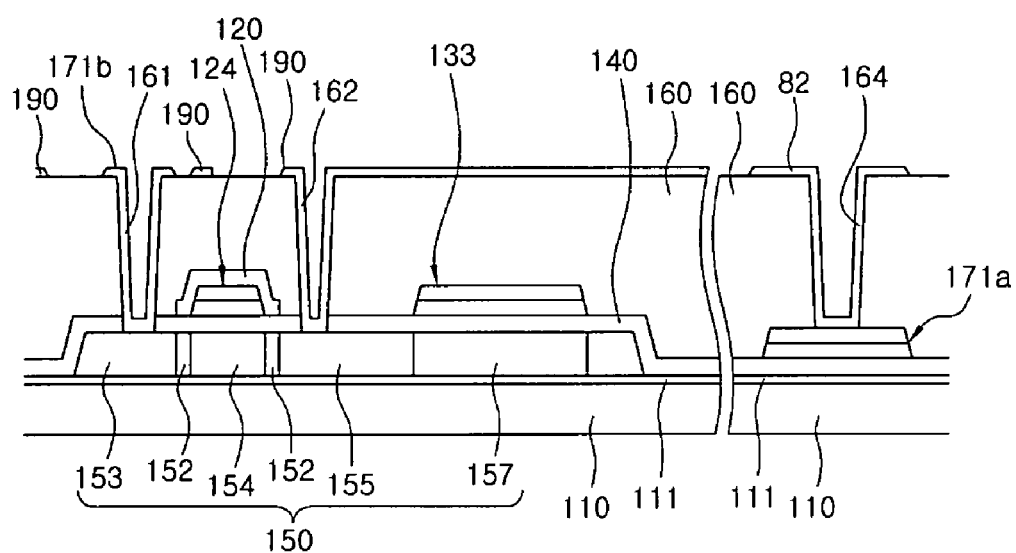
FIG. 11 is a sectional view of the display area shown in FIG. 10 taken along line XI-XI'.

FIG. 10 is a layout view of the TFT array panel 102 according to another embodiment of the present invention, and FIG. 11 is a sectional view of the display area shown in FIG. 10 taken along line XI-XI'.

In this embodiment, a data connection part 171*b* and a pixel electrode 190 may be made of the same material on the same layer, and contact holes 161 and 162 for connecting the data connection part 171*b* with a source region 153 and a drain region 155 of a semiconductor layer 150 are simultaneously formed, respectively. Thus, it is possible to reduce the number of photo masks compared to the embodiment shown in FIGS. 1-9.

Referring to FIGS. 10 and 11, a blocking layer 111 is formed on a transparent insulating substrate 110.

A semiconductor layer 150 is formed on the blocking layer 111 and includes a source region 153 and a drain region 155 which are doped with impurities, and a channel region 154 that is made of intrinsic semiconductor and is interposed between the source region 153 and the drain region 155. The semiconductor layer 150 further comprises lightly doped drain (LDD) regions 152 formed between the source region 153 and the channel region 154, and between the drain region 155 and the channel region 154.

A gate insulating layer 140 made of silicon nitride (SiNx) or silicon oxide (SiO$_2$) is formed on the semiconductor layer 150.

A gate line 121 and a storage electrode line 131, both extending in a transverse direction, and a plurality of data metal pieces 171*a* are formed on the gate insulating layer 140.

A portion of the gate line 121 extends to the semiconductor layer 150 and overlaps the channel region 154 to form a gate electrode 124. An end of the gate line 121 can be formed wider than the rest of the gate line 121 to connect with exterior circuitry (not shown).

Also, a storage electrode line 131 is formed in parallel with the gate line 121. The storage electrode line 131 and the gate line 121 are made of the same material on the same layer. A portion of the storage electrode line 131 overlaps the semiconductor layer 150 to form a storage electrode 133. The portion of the semiconductor layer 150 overlapped with the storage electrode 133 becomes a storage electrode region 157.

A conductor pattern 120 is formed on the gate electrode 124 overlapping the LDD regions 152.

The data metal piece 171*a* is formed on the same layer as the gate line 121 and extends perpendicular to the gate line 121, being separated from the gate line 121 by a predetermined distance. The data metal piece 171*a* is disposed between two adjacent gate lines 121, but it is not connected with them. Also, an end of the outermost data metal piece 171*a* is enlarged to receive image signals from an external circuit (not shown).

An interlayer insulating layer 160 is formed on the gate insulating layer 140, the gate line 121, the storage electrode line 131, and the data metal piece 171*a*.

On the interlayer insulating layer 160, a data connection part 171*b*, a pixel electrode 190, and a contact assistant 82 are formed. The data connection part 171*b* is vertically formed to intersect the gate line 121 and the storage electrode line 131. That is, as shown in FIG. 10, the data connection part 171*b* perpendicularly crosses the gate line 121 and the storage electrode line 131.

The data metal piece 171*a* is connected with the data connection part 171*b* through a third contact hole 163 formed in the interlayer insulating layer 160, and the data connection part 171*b* is connected with the source region 153 through the first contact hole 161. That is, the plurality of data metal pieces 171*a*, which are spaced apart from other data metal pieces 171*a*, are connected to adjacent data metal pieces 171*a* by the data connection parts 171*b* which pass over the gate lines 121 and the storage electrode lines 131.

The pixel electrode 190 is connected with the drain electrode 155 through a second contact hole 162 that is formed in the interlayer insulating layer 160 and the gate insulating layer 140. The contact assistant 82 is connected with the gate line 121 and an end of the data metal piece 171*a* through a fourth contact hole 164 that is formed in the interlayer insulating layer 160.

The contact assistant 82 supplements adhesion between the end portion of the data line 171*a* and external devices and protects them. Accordingly, it is optional to apply the contact assistant 82 or to omit it since it is not essential.

Hereinafter, a method of manufacturing the above-mentioned TFT array panel 102 will be described with reference to FIG. 12A through 15B, along with the above-referenced FIG. 10 and FIG. 11.

Figure 12A:
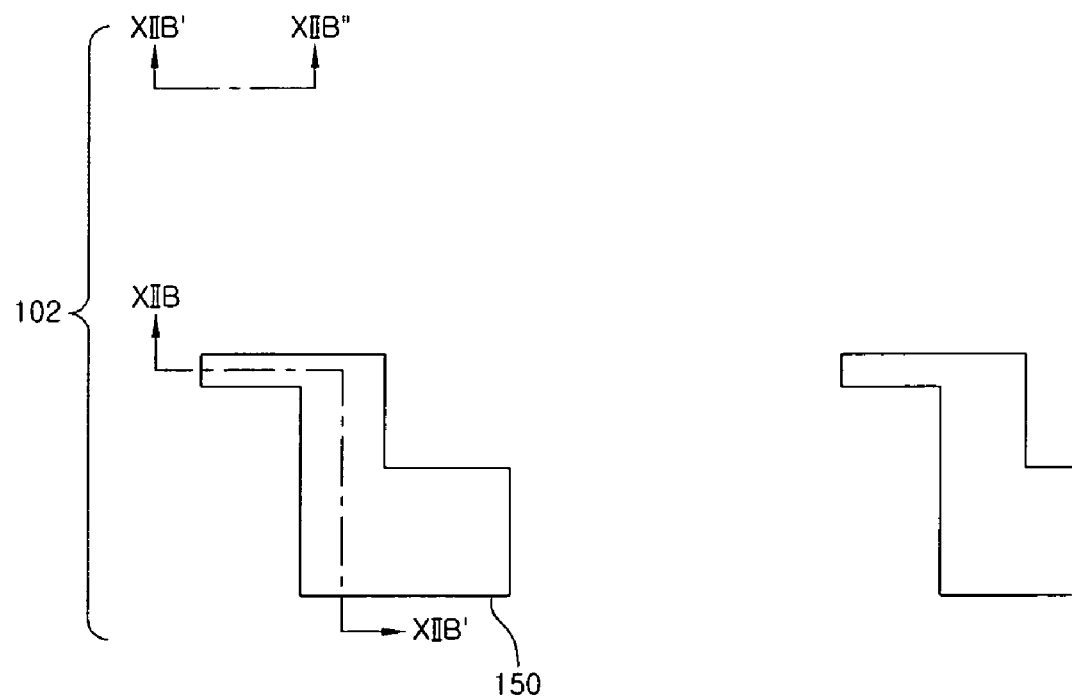
FIGS. 12A, 13A, 14A, and 15A are plan views showing stages of manufacturing a TFT array panel shown in FIGS. 10 and 11 according to an another embodiment of the present invention.
Figure 12B:
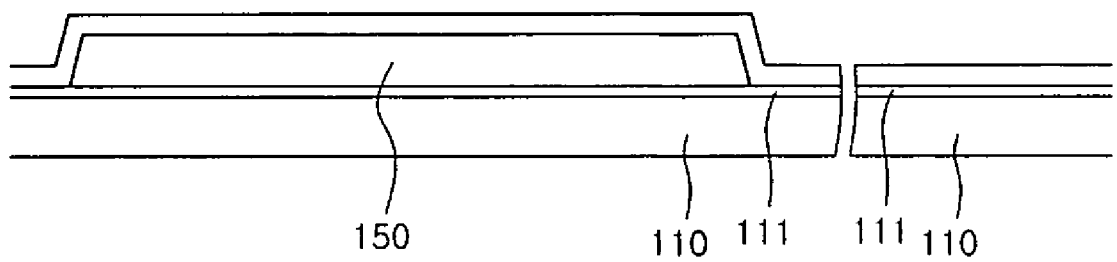
FIG. 12B is a cross-sectional view of the TFT array panel shown in FIG. 12A taken along line XIIB-XIIB'-XIIB"

FIGS. 12A, 13A, 14A, and 15A are plan views showing a process of manufacturing a TFT array panel 102 shown in FIGS. 10 and 11 according to an another embodiment of the present invention, and FIG. 12B is a cross-sectional view of the TFT array panel 102 shown in FIG. 12A taken along line XIIB-XIIB'-XIIB". FIG. 13B is a cross-sectional view of the TFT array panel 102 shown in FIG. 13A taken along line XIIIB-XIIIB'-XIIIB", FIG. 14B is a cross-sectional view of the TFT array panel 102 shown in FIG. 14A taken along line XIVB-XIVB'-XIVB", and FIG. 15B is a cross-sectional view of the TFT array panel 102 shown in FIG. 15A taken along line XVB-XVB'-XVB".

As shown in FIG. 12A and FIG. 12B, a blocking layer 111 is first formed on a transparent insulating substrate 110. The transparent insulating substrate 110 can be made of glass, quartz, sapphire, etc. The blocking layer 111 is formed by depositing silicon oxide (SiO$_2$) or silicon nitride (SiNx) onto the insulating substrate 110 with a thickness of approximately 1000 Å. Then, the surface is cleaned to remove impurities such as a natural oxide layer from the blocking layer 111.

An intrinsic amorphous silicon layer is formed to a thickness within the range of 500 Å to 1500 Å by chemical vapor deposition (CVD), as previously described, or other method.

Next, the amorphous silicon layer is crystallized by a sequential lateral solidification (SLS) process, an excimer laser anneal process, or a chamber anneal process to form a polysilicon layer, all as previously described.

The poly crystalline silicon layer is then patterned by a photo etching process using a photo mask, thereby forming a semiconductor layer 150 made of poly crystalline silicon.

Insulating material such as SiNx, SiO$_2$, etc. is deposited on the semiconductor layer 150 by CVD process to form a gate insulating layer 140.

Figure 13A:
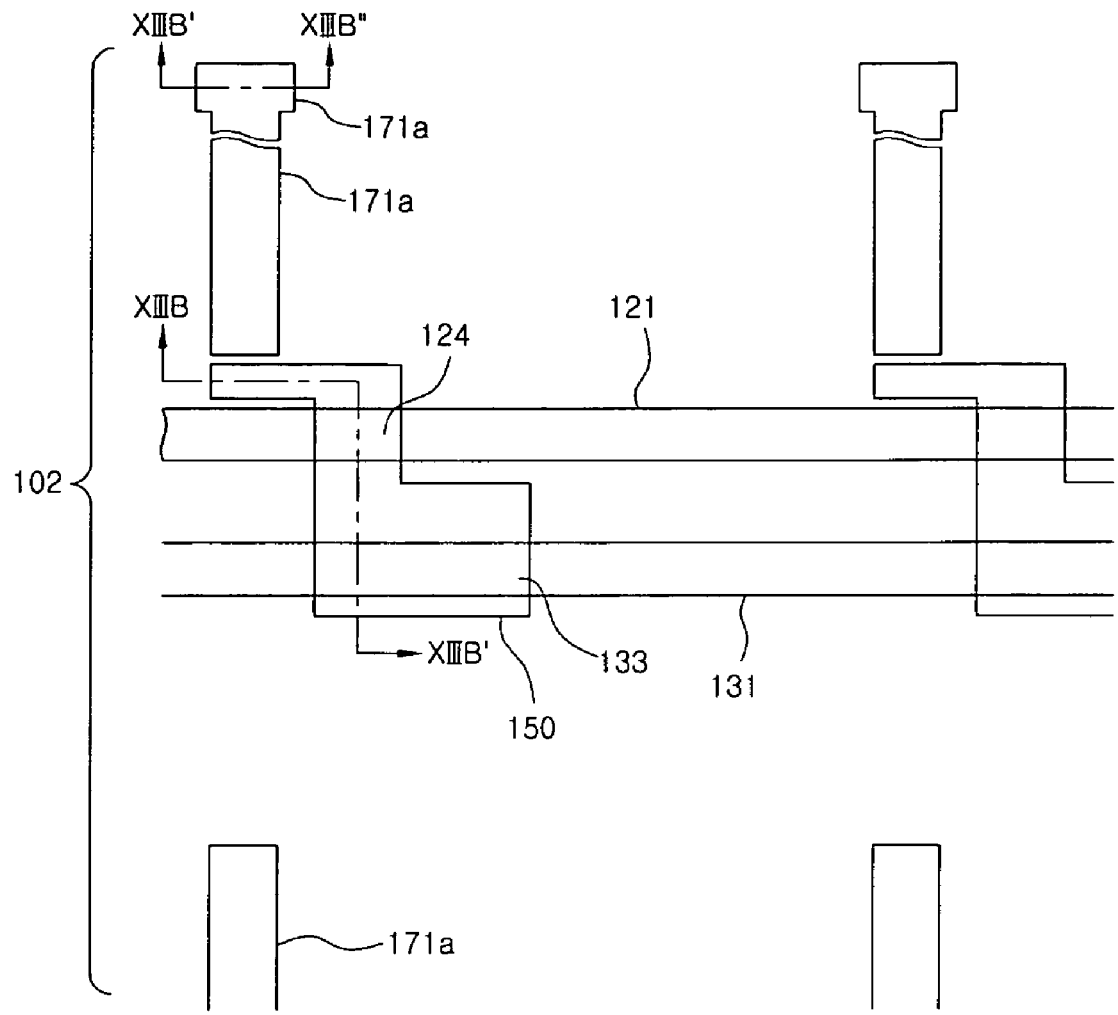
Figure 13B:
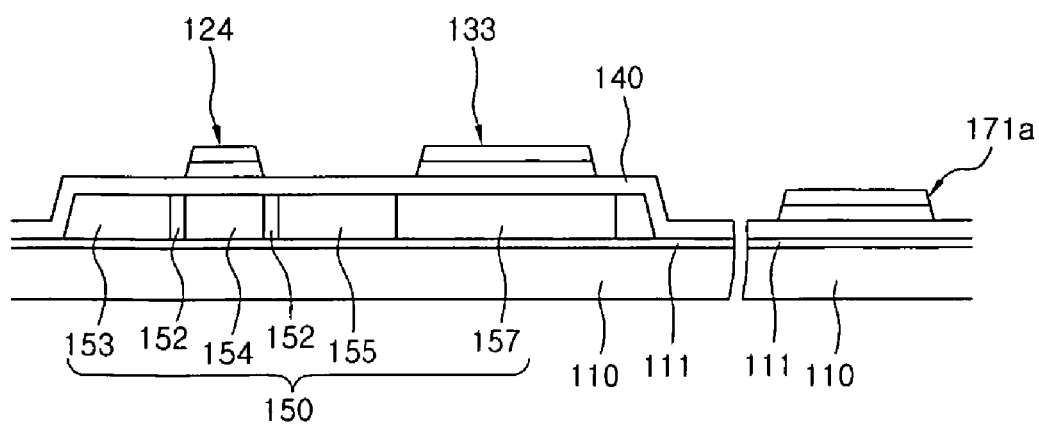
FIG. 13B is a cross-sectional view of the TFT array panel shown in FIG. 13A taken along line XIIIB-XIIIB'-XIIIB"

Thereafter, as shown in FIG. 13A and FIG. 13B, a conductive layer of a double layered structure including a first metal layer and a second metal layer is deposited on the gate insulating layer 140. The first metal layer is deposited directly on the gate insulating layer 140, and the second metal layer is deposited on the first metal layer such that the first metal layer is between the second metal layer and the gate insulating layer 140. The first and the second metal layers are made of at least one of silver (Ag), copper (Cu), titanium (Ti), aluminum (Al), tungsten (W), molybdenum (Mo), neodymium (Nd) and alloy thereof.

After forming the conductive layer, a photoresist layer is deposited on the conductive layer, and etched using a photo mask to form a plurality of gate lines 121 a storage electrode line 131, and a plurality of data metal pieces 171*a*.

A photoresist layer is deposited on the gate insulating layer 140, and developed to form a photoresist pattern. At this time, the first metal layer of the gate electrode 124 is over-etched by using a spray wet-etch method having etch selectivity ratio for the first and the second metal layers in order that the first metal layer of the gate electrode 124 has narrower widths than that of the photoresist pattern and the second metal layer of the gate electrode 124.

The semiconductor layer 150 is heavily doped and lightly doped with conductive impurities with the same method as that of the embodiment of FIGS. 1 and 2 to form a plurality of heavily doped regions 153, 155, and a plurality of lightly doped regions 152, and to define a channel region 154 and a storage region 157.

Figure 14A:
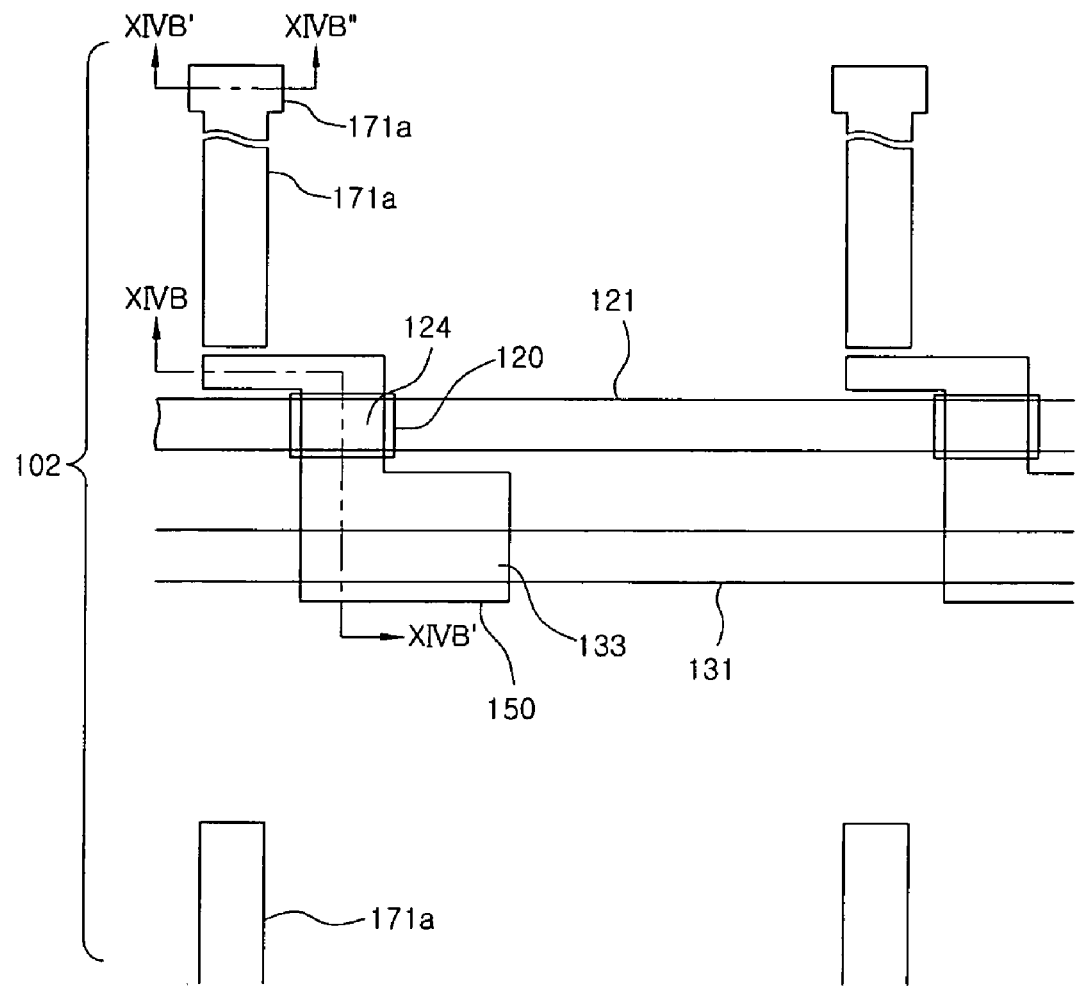
Figure 14B:
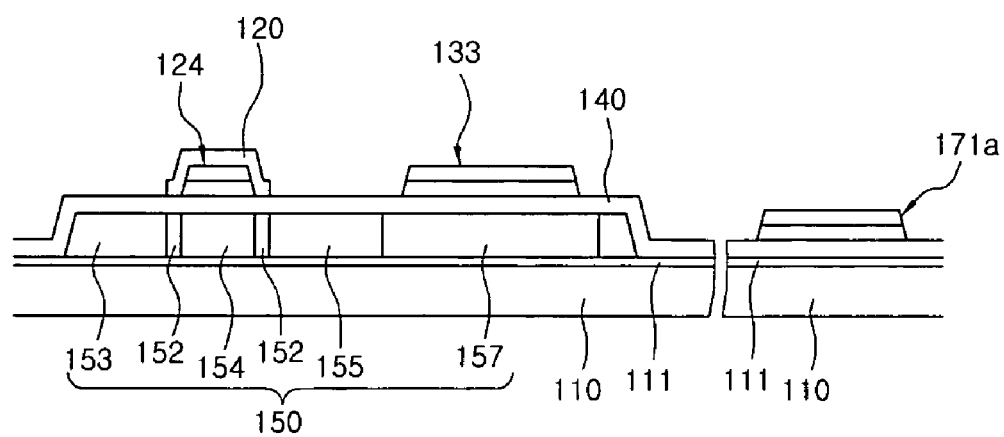
FIG. 14B is a cross-sectional view of the TFT array panel shown in FIG. 14A taken along line XIVB-XIVB'-XIVB"

As shown in FIGS. 14A and 14B, a conductive layer is deposited on the gate line 121, the storage electrode line 131, and the data metal pieces 171*a*, and etched through photolithography using a photo mask to form a plurality of conductor patterns 120 on the gate electrode 124.

At this time, the conductor patterns 120 completely cover the gate electrodes 124, and respectively cover the portion of the semiconductor layer 150 on both sides of the gate electrodes 124.

The semiconductor layers 150 are activated through thermal treatment such as, but not limited to, excimer laser annealing (ELA), etc. This thermal treatment may be executed before forming the conductor pattern 120.

Figure 15A:
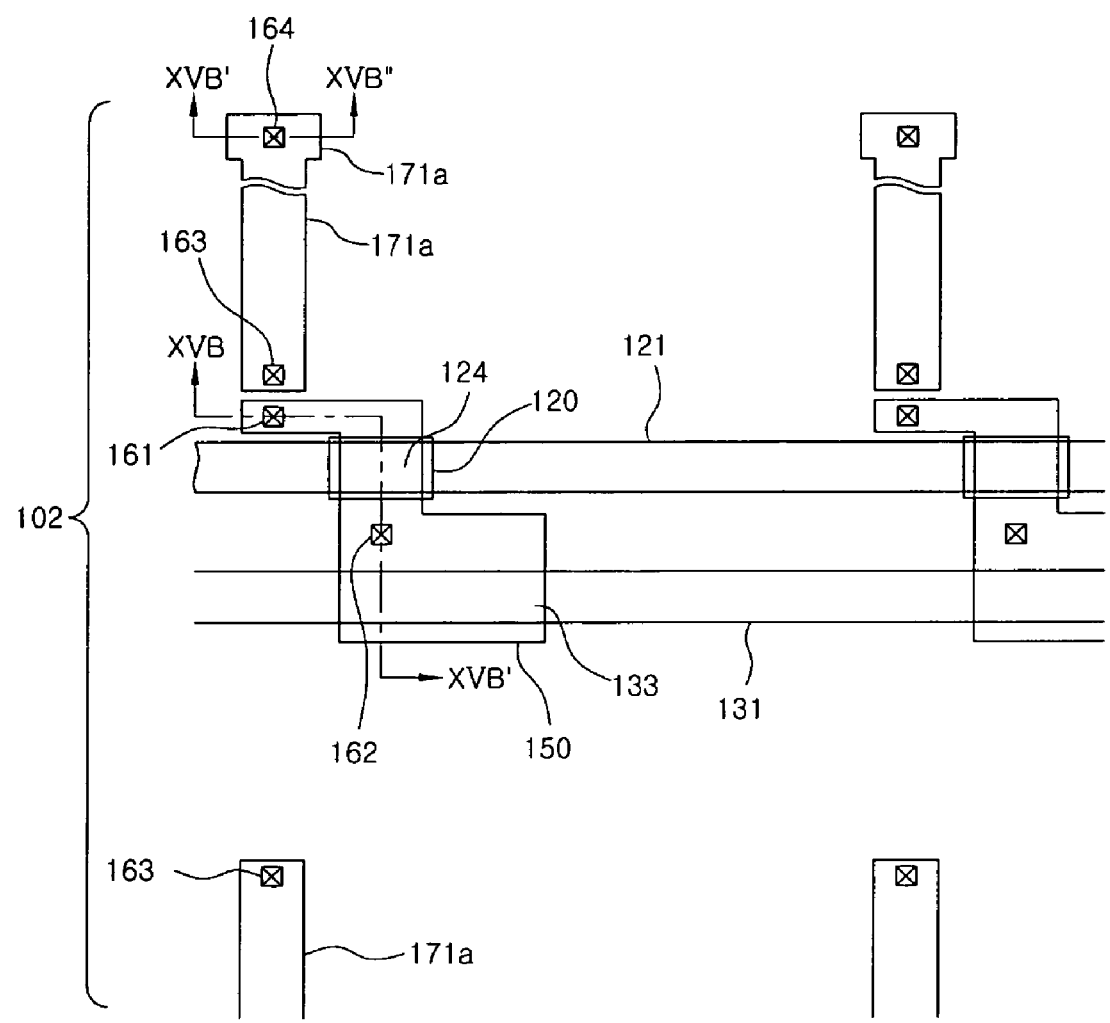
Figure 15B:
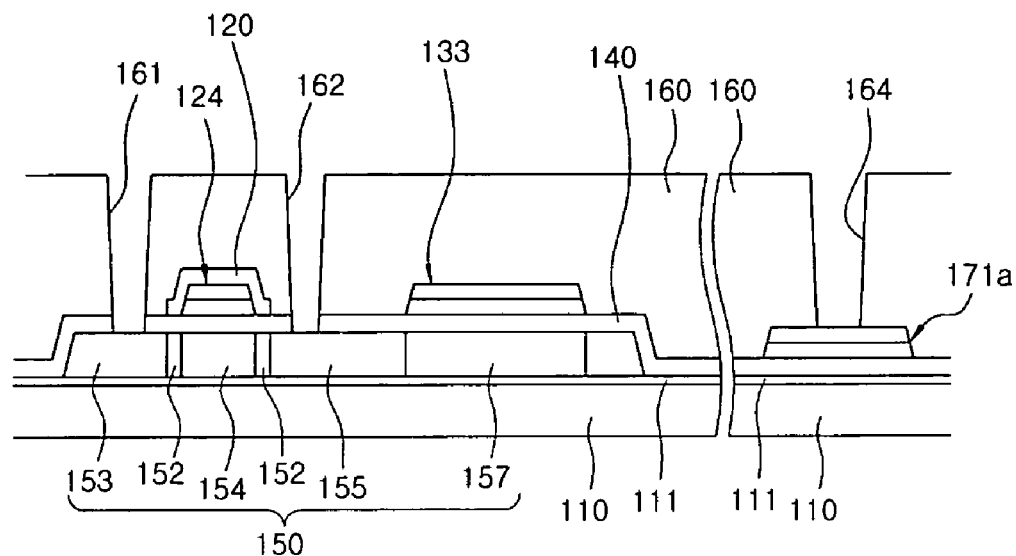
FIG. 15B is a cross-sectional view of the TFT array panel shown in FIG. 15A taken along line XVB-XVB'-XVB"

As shown in FIGS. 15A and 15B, an interlayer insulating layer 160 is deposited on the entire substrate 110 including the source region 153, the drain region 155, and the channel region 154. The interlayer insulating layer 160 can be made of an organic material having a prominent planarization property and photosensitivity, an insulating material having low dielectric constant such as a-Si:C:O and a-Si:O:F, which is formed by plasma enhanced chemical vapor deposition (PECVD), or an inorganic material such as SiNx, etc.

The interlayer insulating layer 160 is etched to form a first contact hole 161 where the source region 153 is exposed, a second contact hole 162 where the drain region 155 is exposed, a third contact hole 163 where the data metal piece 171*a* is exposed, and a fourth contact hole 164 where an end of the data metal piece 171*a* is exposed.

In a case where the interlayer insulating layer 160 is made of organic materials having photo-sensitivity, the contact holes can be formed only by the photolithography process.

As shown in FIG. 10 and FIG. 11, transparent conductive material is deposited on the interlayer insulating layer 160 including inner surfaces of the first contact hole 161, the second contact hole 162, the third contact hole 163, and the fourth contact hole 164, thereby forming a conductive layer. The conductive layer is then patterned to form a data connection part 171*b*, a pixel electrode 190, and a contact assistant 82.

Here, the data metal piece 171*a* is connected with the data connection part 171*b* through the third contact hole 163, and the data connection part 171*b* is connected with the source region 153 through the first contact hole 161. The pixel electrode 190 is connected with the drain region 155 through the second contact hole 162, and the contact assistant 82 is connected with the data metal piece 171*a* through the fourth contact hole 164.

In a case where the second interlayer insulating layer 160 is made of insulating materials of low dielectric constant, the pixel electrode 190 may overlap the data metal piece 171*a* and the gate line 121, so that the aperture ratio of the pixel electrode 190 is enhanced.

Hereinafter, another method of manufacturing a driver of a TFT array panel will be described with reference to FIGS. 16 through 27.

FIGS. 16 to 27 are cross-sectional views showing intermediate steps to manufacture a driver of a TFT array panel 100 shown in FIGS. 1 and 2.

Figure 16:
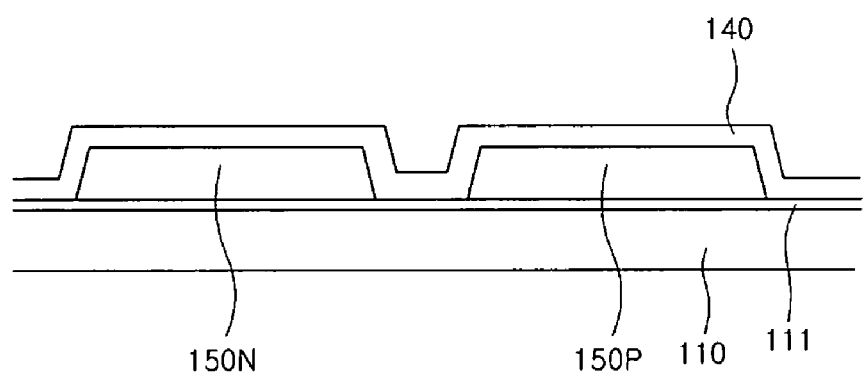
FIGS. 16 to 27 are cross-sectional views showing stages of manufacturing a driver of a TFT array panel shown in FIGS. 1 and 2 according to the present invention.

As shown in FIG. 16, a blocking layer 111 is formed on a transparent insulating substrate 110. The transparent insulating substrate 110 can be made of glass, quartz, sapphire, etc. The blocking layer 111 is formed by depositing silicon oxide ($SiO_2$) or silicon nitride (SiNx) with a thickness of about 1000 Å. Then, the surface is cleaned to remove impurities such as natural oxide layer from the blocking layer 111.

An intrinsic amorphous silicon layer is formed within the range of 500 Å to 1500 Å thick by chemical vapor deposition (CVD), etc.

The amorphous silicon layer is crystallized by a sequential lateral solidification (SLS) process, an excimer laser annealing process, or a chamber anneal process to form a poly crystalline silicon layer. The poly crystalline silicon layer is patterned by photolithography using an optic mask to form a plurality of semiconductor layers 150N and 150P.

Insulating material such as SiNx, $SiO_2$, etc. is deposited on the semiconductor layers 150N and 150P by CVD process to form a gate insulating layer 140.

Figure 17:
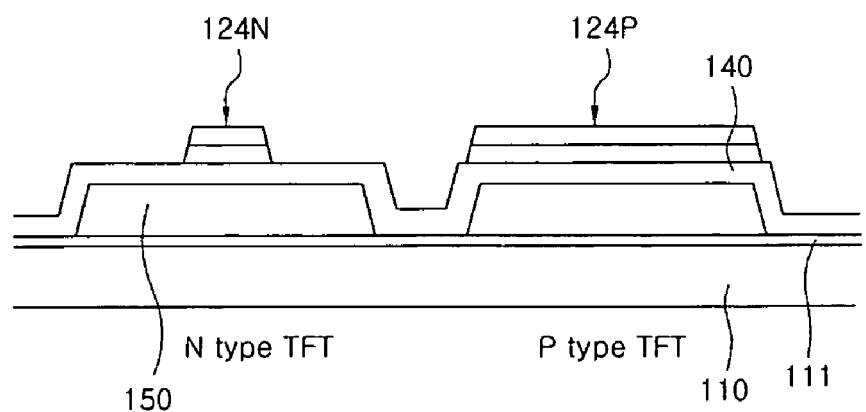

As shown in FIG. 17, a conductive layer of a double layered structure including a first metal layer and a second metal layer is deposited on the gate insulating layer 140. The first and the second metal layers are made of at least one of silver (Ag), copper (Cu), titanium (Ti), aluminum (Al), tungsten (W), molybdenum (Mo), neodymium (Nd) and alloy thereof.

After forming the conductive layer, a photoresist layer is deposited on the conductive layer, and etched using a photo mask to respectively form a plurality of gate electrodes 124N and 124P for an N type TFT (where concentration of electrons is higher than concentration of holes) and a P type TFT (where concentration of holes is higher than concentration of electrons).

Figure 18:
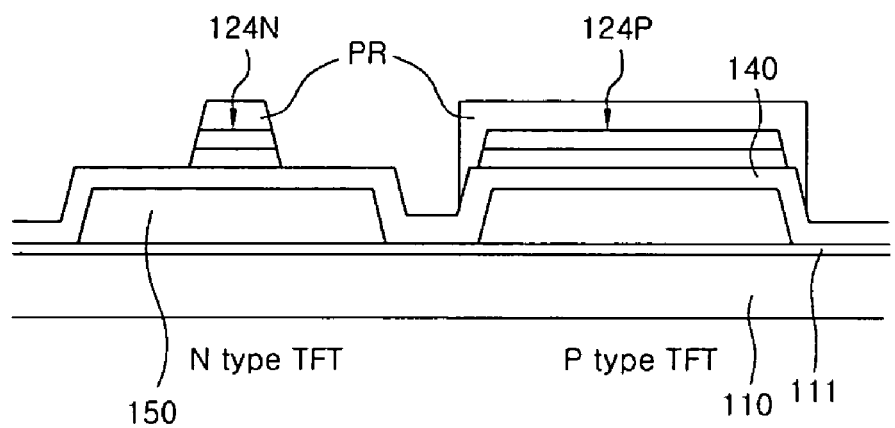

As shown in FIG. 18, a photoresist layer is deposited on the gate insulating layer 140, and developed to form a photoresist pattern PR. At this time, the portion of the photoresist pattern PR for the N type TFT has substantially the same width as that of the second metal layer of the gate electrode 124N, and the portion of the photoresist pattern PR for the P type TFT completely covers the gate electrode 124P and the semiconductor layer 150P for P type TFT.

Figure 19:
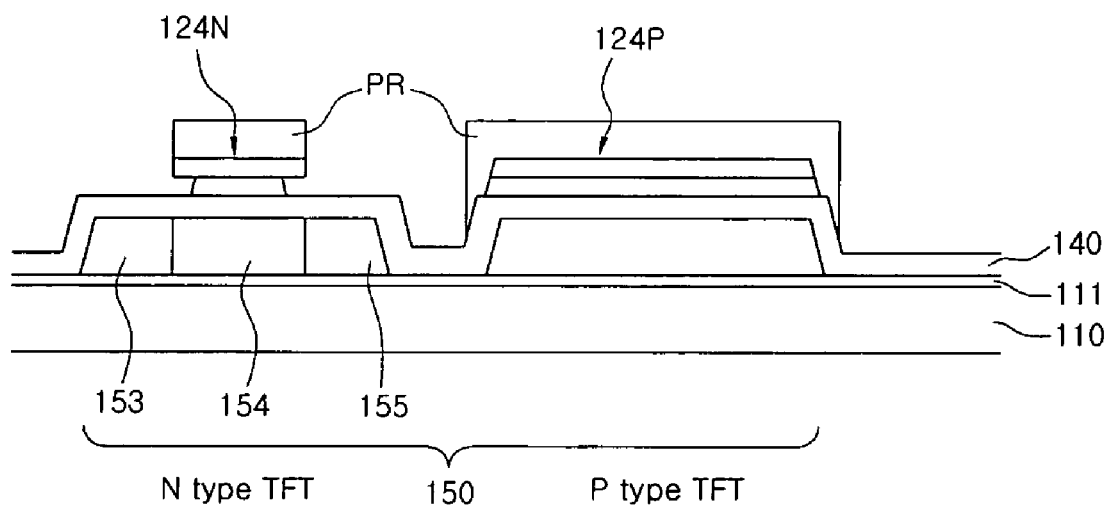

As shown in FIG. 19, the first metal layer of the gate electrode 124N is over-etched by using spray wet-etch method having etch selectivity ratio for the first and the second metal layers in order that the first metal layer of the gate electrode 124N has a narrower width than that of the photoresist pattern PR and the second metal layer of the gate electrode 124N.

Figure 20:
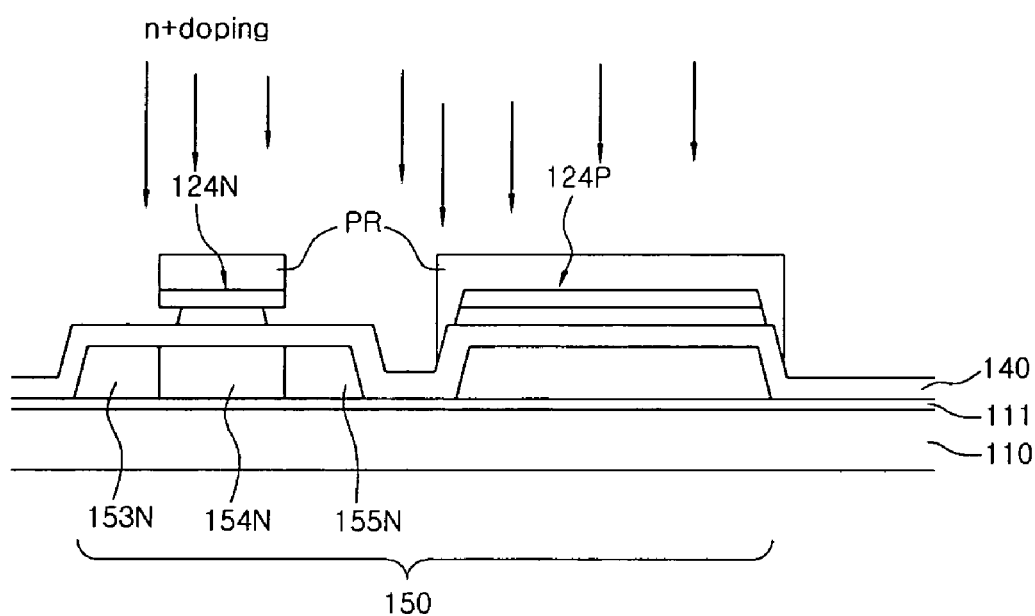

As shown in FIG. 20, the semiconductor layer 150 is heavily doped with conductive impurities using the second metal layer of the gate electrode 124N and the photoresist pattern PR as a doping mask to form source region 153N and a drain region 155N, and to respectively define a channel region 154N for the N type TFT.

Figure 21:
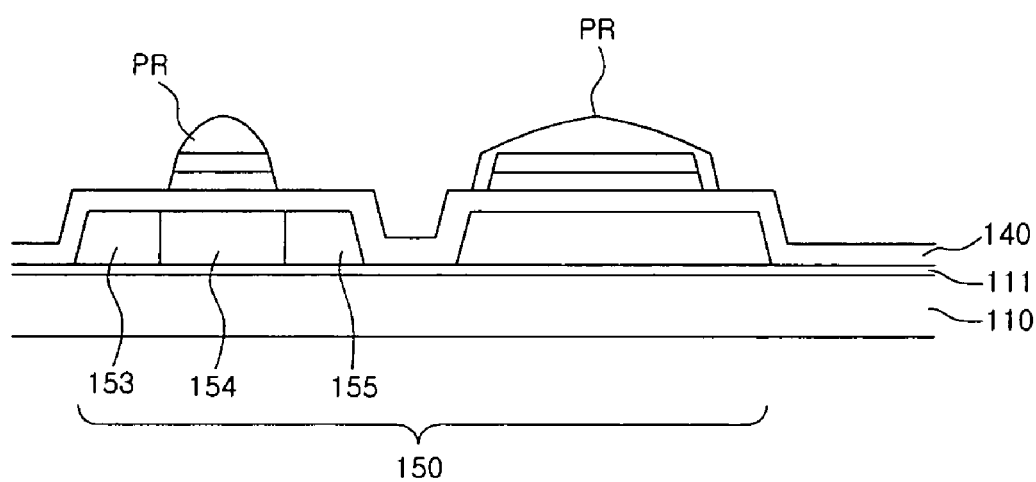

As shown in FIG. 21, the photoresist pattern PR is ashed to expose the portion of the second metal layer of the gate electrode 124N, and the exposed second metal layer of the gate electrode 124N is etched by dry etching, thereby the width of the second metal layer of the gate electrode 124N and the photoresist pattern PR on the gate electrode 124N is substantially equal to the width of the first metal layer of the gate electrode 124N.

Figure 22:
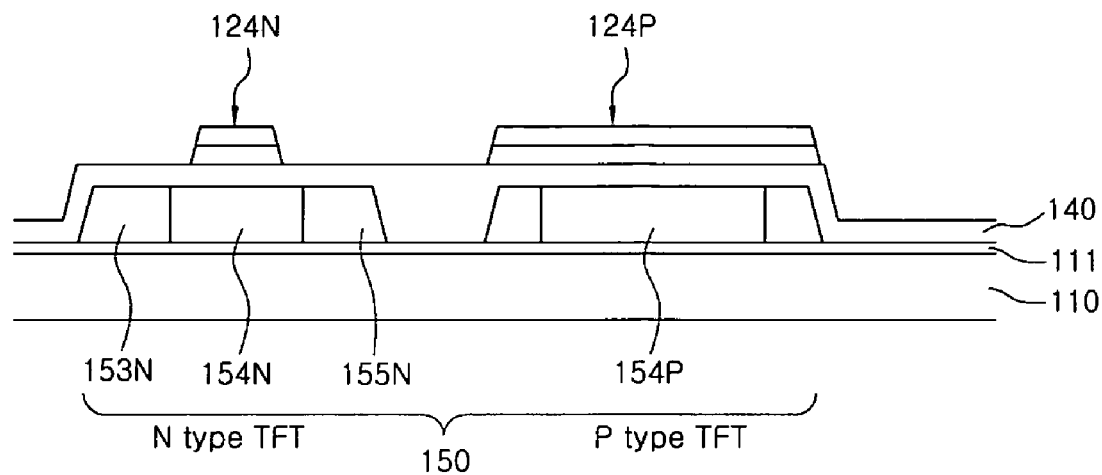

The photoresist pattern PR is removed, as shown in FIG. 22.

Figure 23:
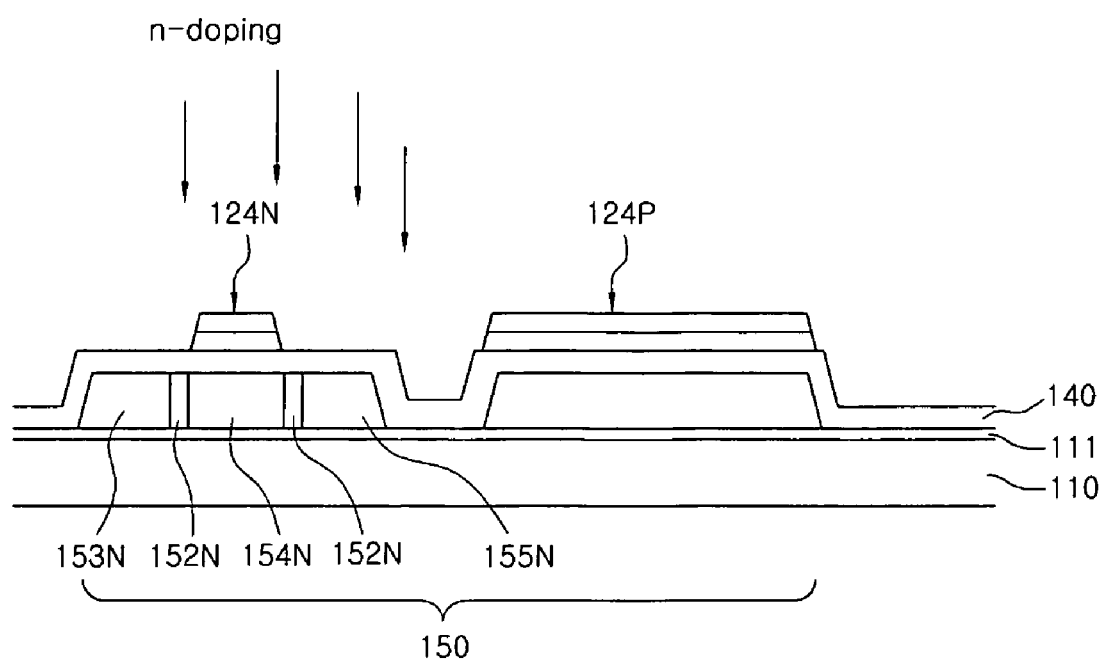

As shown in FIG. 23, the semiconductor layer 150N is lightly doped with conductive impurities using a doping mask of the gate electrodes 124N and 124P, thereby completing the semiconductor layer 150N having LDD regions 152N for the N type TFT.

Figure 24:
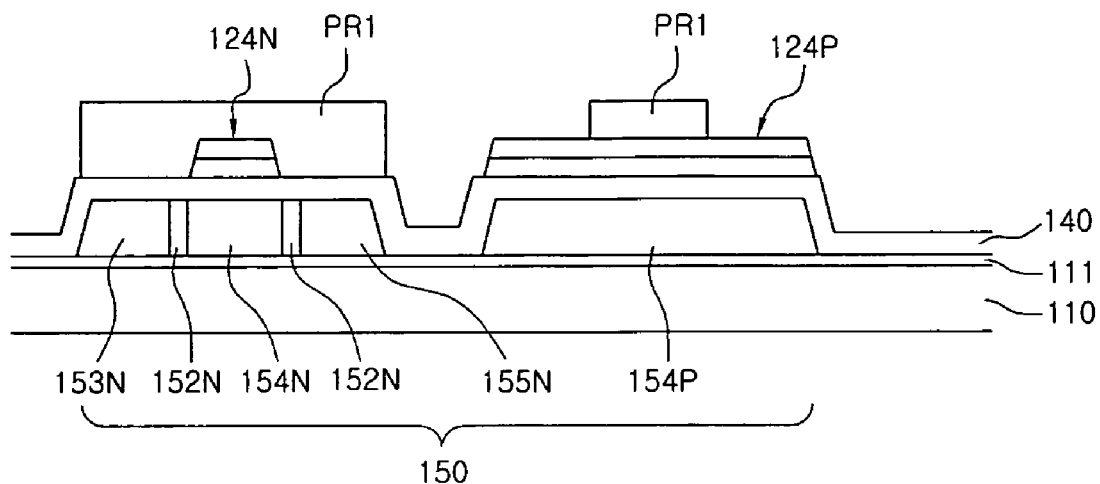

As shown in FIG. 24, a photoresist layer is deposited on the gate insulating layer 140, and developed to form a photoresist pattern PR1. At this time, the portion of the photoresist pattern PR1 for the N type TFT completely covers the gate electrode 124N and the semiconductor layer 150N, and the portion of the photoresist pattern PR1 for the P type TFT is located on the gate electrode 124P.

Figure 25:
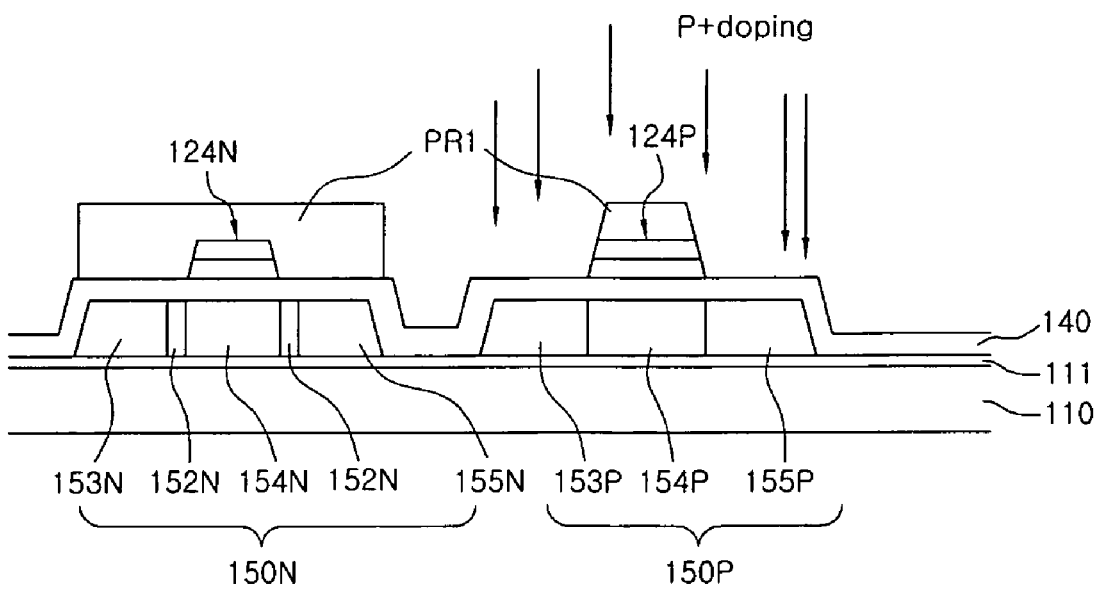

Then, as shown in FIG. 25, the portion of the gate electrode 124P for the P type TFT is etched by using the photoresist pattern PR1 as an etch mask, and the semiconductor layer 150 is heavily doped with conductive impurities using the gate electrode 124P and the photoresist pattern PR1 as a doping mask to form heavily doped regions 153P and 155P, and to respectively define a channel region 154P for the P type TFT.

Figure 26:
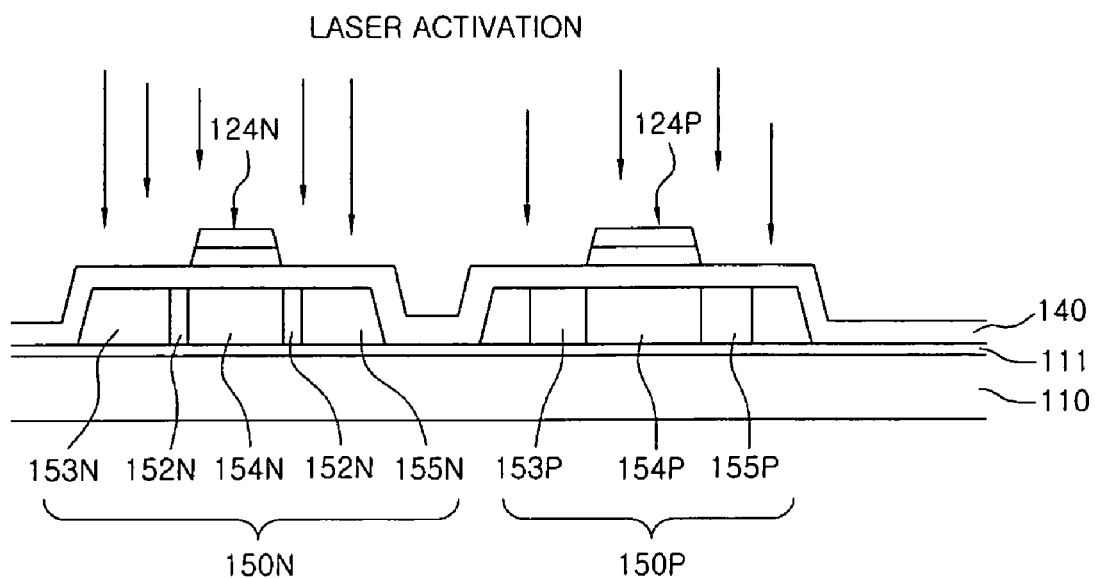

As shown in FIG. 26, the semiconductor layers 150N and 150P are activated through thermal treatment such as excimer laser annealing (ELA), etc.

Figure 27:
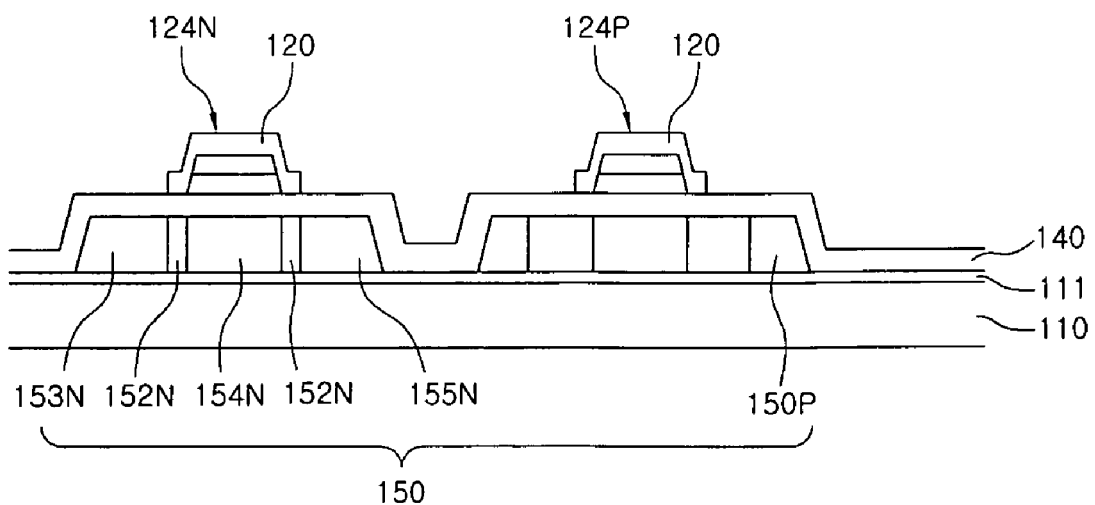

As shown in FIG. 27, a conductive layer is deposited on the gate insulating layer 140 and the gate electrodes 124P and 124N, and etched through photolithography using a photo mask to form a plurality of conductor patterns 120.

At this time, the conductor patterns 120 completely cover the gate electrodes 124N and 124P, and cover the portion of the semiconductor layers 150N and 150P on both sides of the gate electrodes 124N and 124P.

The conductor patterns 120, as illustrated, have an island shape, but may be extended to have the same shape as that of the gate lines 121 and the storage line 131, and alternate various shapes are within the scope of this embodiment.

As described above, the manufacturing method forming stable GOLDD by executing excimer laser annealing activation at a time is provided, such that the reliability and characteristics of thin film transistors may be enhanced.

The above descriptions may be adapted to other flat panel display devices such as, but not limited to, OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method of manufacturing a thin film transistor, the method comprising:
    forming a semiconductor layer of poly silicon;
    forming a gate insulating layer on the semiconductor layer;
    forming a conductive layer including a first metal layer and a second metal layer formed on the first metal layer;
    depositing and forming a photoresist pattern on the first and the second metal layer;
    forming a gate electrode by etching the conductive layer, wherein the gate electrode includes a double layered structure including the first metal layer having a narrower width than a width of the second metal layer;
    forming a source region and a drain region in the semiconductor layer by doping conductive impurities;
    ashing the photoresist pattern to expose a portion of the second metal layer;
    etching the exposed portion of the second metal layer;
    removing the photoresist pattern; and
    forming lightly doped drain regions having a lower concentration compared to the source and the drain regions by using the gate electrode as a doping mask.

2. The method of claim 1, wherein the second metal layer is used as a doping mask when the source and the drain regions are formed.

3. The method of claim 2 wherein the second metal layer has substantially a same width as the first metal layer after etching the exposed portion of the second metal layer; and
    wherein the method further comprising forming lightly doped drain regions having a lower concentration compared to the source and the drain regions by using the first and the second metal layer as a mask.

4. The method of claim 3, further comprising:
    activating conductive impurities in the semiconductor layer by using excimer laser annealing or chamber annealing.

5. The method of claim 4, further comprising:
    forming a conductor pattern covering the gate electrode and a portion of the semiconductor layer exposed from the gate electrode.

6. The method of claim 1, wherein the first metal layer is over-etched by using spray wet-etch method when the gate electrode is formed.

7. The method of claim 6, wherein the spray wet-etch method has etch selectivity for the first and the second metal layers.

8. The method of claim 7, wherein the double layered structure of the first and the second metal layers include one selected from Al/Mo, Mo/Al, Al-Nd alloy/Mo-W alloy, Mo-W alloy/Al-Nd alloy, and Mo/ITO.

9. The method of claim 8, wherein thicknesses of the first and the second metal layers are in a range of about 1,000-2,500Å.

10. The method of claim 1, wherein forming the gate electrode comprises:
    etching the first and the second metal layer together; and
    forming the first metal layer having under-cut structure by using electro chemical reaction between the first and the second metal layers.

11. The method of claim 10, wherein the first and the second metal layers comprise materials having substantially same etch ratio for aluminum etchant.

12. The method of claim 11, wherein the first and the second metal layers are etched by using spray wet-etch method when the gate electrode is formed.

13. The method of claim 12, wherein the double layered structure of the first and the second layers include one selected from Al/Mo, Mo/Al, Al-Nd alloy/Mo-W alloy, Mo-W alloy/Al-Nd alloy, and Mo/ITO.

14. The method of claim 13, wherein thicknesses of the first and the second metal layers respectively are in a range of about 1,000-2,500Å.

15. A method of manufacturing a thin film transistor, the method comprising:

forming a semiconductor layer on a substrate;

forming a gate insulating layer on the semiconductor layer;

forming a first metal layer on the gate insulating layer, and forming a second metal layer on the first metal layer;

forming a gate line and a gate electrode from the first and second metal layers;

forming a plurality of data metal pieces from the first and second metal layers, wherein the data metal pieces extend perpendicularly to the gate line, and wherein the data metal pieces do not connect with the gate line;

forming the first metal layer of the gate electrode to have a narrower width than the second metal layer of the gate electrode;

doping the semiconductor layer using the second metal layer of the gate electrode as a mask;

forming the second metal layer of the gate electrode to have a substantially same width as the first metal layer of the gate electrode;

doping the semiconductor layer using the gate electrode as a mask;

forming an interlayer insulating layer on the gate insulating layer, the gate line, the gate electrode, and the data metal pieces;

forming a data connection part on the interlayer insulating layer, wherein the data connection part passes perpendicularly over the gate line; and connecting the data connection part to a first data metal piece at a first contact hole and connecting the data connection part to a second data metal piece at a second contact hole.

16. The method of claim 15, further comprising:

forming a pixel electrode on the interlayer insulating layer; and connecting the pixel electrode to the semiconductor layer through a third contact hole.

17. A method of manufacturing a driver of a thin film transistor, the method comprising:

forming first and second semiconductor layers of polysilicon;

forming a conductive layer including a first metal layer and a second metal layer formed on the first metal layer over the first and second semiconductor layers;

forming first and second gate electrodes from the conductive layer; and forming first and second photoresist patterns on the first and second gate electrodes, respectively, wherein the first photoresist pattern has a width equivalent to a width of a second metal layer for the first gate electrode, and wherein a second photoresist pattern covers all accessible surfaces of the second gate electrode;

wherein, for the first semiconductor layer and the first gate electrode, the method further comprises:

etching the first metal layer for providing the first metal layer with a narrow width than a second metal layer and the first photoresist pattern;

using the second metal layer and the first photoresist pattern as a doping mask to form a source region and a drain region in the first semiconductor layer;

exposing the second metal layer and processing the second metal layer to have a width substantially the same as a width of the first metal layer thereof; and forming lightly doped drain regions having a lower concentration compared to the source and the drain regions by using the first gate electrode as a doping mask.

18. The method of claim 17, further comprising:

depositing third and fourth photoresist patterns on the first and second gate electrodes, respectively, wherein the third photoresist pattern covers all accessible surfaces of the first gate electrode and wherein the fourth photoresist pattern and the fourth photoresist pattern partially covers the second gate electrode;

wherein, for the second gate electrode and the second semiconductor layer, the method further comprises:

forming the second gate electrode by etching the second photoresist pattern, and the first and second metal layers; and forming a source region and a drain region in the second semiconductor layer by doping conductive impurities.

19. The method of claim 18, further comprising activating conductive impurities in the first and second semiconductor layers through excimer laser annealing.

20. The method of claim 17, wherein the first semiconductor layer and the first gate electrode are for an N type thin film transistor, and wherein the second semiconductor layer and the second gate electrode are for a P type thin film transistor.

* * * * *